(12) United States Patent
Noori et al.

(10) Patent No.: US 12,394,733 B2
(45) Date of Patent: Aug. 19, 2025

(54) STACKED RF CIRCUIT TOPOLOGY

(71) Applicant: MACOM Technology Solutions Holdings, Inc., Durham, NC (US)

(72) Inventors: Basim Noori, San Jose, CA (US); Marvin Marbell, Morgan Hill, CA (US); Kwangmo Chris Lim, San Jose, CA (US); Qianli Mu, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 440 days.

(21) Appl. No.: 17/210,660

(22) Filed: Mar. 24, 2021

(65) Prior Publication Data

US 2021/0313284 A1 Oct. 7, 2021

Related U.S. Application Data

(60) Provisional application No. 63/004,760, filed on Apr. 3, 2020.

(51) Int. Cl.
*H01L 23/66* (2006.01)
*H01L 23/538* (2006.01)
(Continued)

(52) U.S. Cl.
CPC .......... *H01L 23/66* (2013.01); *H01L 23/5386* (2013.01); *H01L 25/0657* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 3,969,745 A 7/1976 Blocker
6,586,833 B2 * 7/2003 Baliga ................ H10D 30/0291
257/691
(Continued)

FOREIGN PATENT DOCUMENTS

EP 1693891 B1 7/2019
EP 3783663 A1 2/2021
(Continued)

OTHER PUBLICATIONS

"Notification of Transmittal of the International Search Report and the Written Opinion of the International Searching Authority, or the Declaration for corresponding International Application No. PCT/US2021/021845, mailing date: Jul. 5, 2021, (14 pages)".

(Continued)

*Primary Examiner* — Wael M Fahmy
*Assistant Examiner* — Quinton A Brasfield
(74) *Attorney, Agent, or Firm* — Myers Bigel, P.A.

(57) ABSTRACT

An integrated circuit device package includes a substrate, a first die comprising active electronic components attached to the substrate, and package leads configured to conduct electrical signals between the first die and an external device. At least one integrated interconnect structure is provided on the first die opposite the substrate. The at least one integrated interconnect structure extends from the first die to an adjacent die attached to the substrate and/or to at least one of the package leads, and provides electrical connection therebetween. Related devices and power amplifier circuits are also discussed.

22 Claims, 17 Drawing Sheets

(51) Int. Cl.
*H01L 25/065* (2023.01)
*H03F 3/193* (2006.01)
*H03F 3/195* (2006.01)
*H03F 3/213* (2006.01)
*H10D 62/832* (2025.01)
*H10D 62/85* (2025.01)

(52) U.S. Cl.
CPC ............. *H03F 3/193* (2013.01); *H03F 3/195* (2013.01); *H03F 3/213* (2013.01); *H10D 62/8325* (2025.01); *H10D 62/8503* (2025.01)

(58) Field of Classification Search
CPC .. H01L 25/0756; H01L 25/112; H01L 25/117; H01L 2224/08145; H01L 27/0688; H01L 23/49827; H01L 23/5384; H01L 23/481; H01L 29/4175; H01L 2225/06541–06544; H01L 2225/06548; H01L 21/76898; H03F 3/139; H03F 3/195; H03F 3/213; H03F 3/2171

See application file for complete search history.

(56) References Cited

U.S. PATENT DOCUMENTS

| | | | |
|---|---|---|---|
| 9,786,660 | B1 | 10/2017 | Farrell et al. |
| 9,807,882 | B1 | 10/2017 | Berdy et al. |
| 10,438,894 | B1 | 10/2019 | Farooq et al. |
| 10,855,244 | B2 | 12/2020 | Trang et al. |
| 11,114,988 | B2 | 9/2021 | Kim et al. |
| 11,521,957 | B1 | 12/2022 | Lee |
| 11,557,539 | B1 | 1/2023 | Romanczyk et al. |
| 11,587,852 | B2 | 2/2023 | Shilimkar et al. |
| 11,652,461 | B2 | 5/2023 | Trang et al. |
| 11,735,538 | B2 | 8/2023 | Radulescu |
| 2002/0179945 | A1 | 12/2002 | Sakamoto et al. |
| 2003/0062541 | A1* | 4/2003 | Warner .............. H01L 24/50 257/E23.092 |
| 2004/0238857 | A1* | 12/2004 | Beroz .............. H01L 23/49822 257/E23.092 |
| 2008/0099800 | A1* | 5/2008 | Miller .............. H01L 23/66 257/738 |
| 2009/0020848 | A1 | 1/2009 | Ono et al. |
| 2009/0091011 | A1 | 4/2009 | Das et al. |
| 2010/0109052 | A1 | 5/2010 | Nakajima et al. |
| 2011/0215472 | A1* | 9/2011 | Chandrasekaran ..... H01L 24/73 257/737 |
| 2011/0304013 | A1 | 12/2011 | Chen et al. |
| 2011/0309372 | A1 | 12/2011 | Xin et al. |
| 2012/0018892 | A1 | 1/2012 | Soltan |
| 2012/0086497 | A1 | 4/2012 | Vorhaus |
| 2012/0299178 | A1 | 11/2012 | Kanaya et al. |
| 2013/0168854 | A1 | 7/2013 | Karikalan et al. |
| 2014/0014969 | A1 | 1/2014 | Kunii et al. |
| 2014/0054604 | A1 | 2/2014 | Ritenour |
| 2014/0159118 | A1 | 6/2014 | Lenci et al. |
| 2014/0184357 | A1 | 7/2014 | Jang |
| 2014/0239411 | A1 | 8/2014 | Brech et al. |
| 2014/0312458 | A1 | 10/2014 | Ashrafzadeh et al. |
| 2015/0171015 | A1* | 6/2015 | Mahajan ............. H01L 23/3114 257/774 |
| 2015/0171080 | A1 | 6/2015 | Vorhaus |
| 2016/0087586 | A1* | 3/2016 | Szymanowski ......... H01L 24/49 330/250 |
| 2016/0285418 | A1 | 9/2016 | Jones et al. |
| 2017/0025349 | A1 | 1/2017 | Wood |
| 2017/0053909 | A1 | 2/2017 | Laighton et al. |
| 2017/0062319 | A1 | 3/2017 | Guo et al. |
| 2017/0085228 | A1 | 3/2017 | Abdo et al. |
| 2017/0110451 | A1 | 4/2017 | Fraser et al. |
| 2017/0294528 | A1 | 10/2017 | Ren et al. |
| 2018/0138132 | A1 | 5/2018 | Nishizawa et al. |
| 2019/0088607 | A1 | 3/2019 | Wang et al. |
| 2019/0097001 | A1 | 3/2019 | Laroche et al. |
| 2019/0131273 | A1 | 5/2019 | Chen et al. |
| 2019/0148276 | A1* | 5/2019 | Chen .................... H01L 21/563 257/774 |
| 2019/0199289 | A1 | 6/2019 | Wei et al. |
| 2019/0304913 | A1* | 10/2019 | Wu .................... H01L 23/5384 |
| 2019/0304952 | A1* | 10/2019 | Weis ...................... H01L 24/16 |
| 2019/0356274 | A1 | 11/2019 | Zhu et al. |
| 2020/0043946 | A1 | 2/2020 | Paul et al. |
| 2020/0105741 | A1 | 4/2020 | Lin et al. |
| 2020/0118922 | A1 | 4/2020 | Hill |
| 2020/0135766 | A1 | 4/2020 | Dutta et al. |
| 2020/0168602 | A1 | 5/2020 | Kojima et al. |
| 2020/0287536 | A1 | 9/2020 | Udrea et al. |
| 2020/0373892 | A1 | 11/2020 | Kim et al. |
| 2021/0098408 | A1* | 4/2021 | Ting ................. H01L 23/49816 |
| 2021/0151428 | A1 | 5/2021 | Dutta et al. |
| 2021/0167199 | A1 | 6/2021 | Sriram et al. |
| 2021/0202408 | A1 | 7/2021 | Khalil et al. |
| 2021/0257472 | A1 | 8/2021 | Sato et al. |
| 2021/0313285 | A1 | 10/2021 | Noori et al. |
| 2021/0313935 | A1 | 10/2021 | Noori et al. |
| 2021/0398971 | A1 | 12/2021 | Som et al. |
| 2022/0020874 | A1 | 1/2022 | Fisher et al. |
| 2022/0044986 | A1 | 2/2022 | Khalil et al. |
| 2022/0190126 | A1 | 6/2022 | Kabir et al. |
| 2023/0075505 | A1 | 3/2023 | Radulescu et al. |
| 2023/0421117 | A1 | 12/2023 | Devita et al. |
| 2023/0421119 | A1 | 12/2023 | Komposch et al. |
| 2024/0071962 | A1 | 2/2024 | Noori et al. |
| 2024/0106397 | A1 | 3/2024 | Marbell et al. |

FOREIGN PATENT DOCUMENTS

| | | |
|---|---|---|
| JP | H065634 B2 | 1/1994 |
| JP | H06267996 A | 9/1994 |
| JP | H1197616 A | 4/1999 |
| JP | 2006066719 A | 3/2006 |
| JP | 2006310726 A | 11/2006 |
| JP | 2008193097 A | 8/2008 |
| JP | 2010165789 A | 7/2010 |
| JP | 2010183100 A | 8/2010 |
| JP | 2011108813 A | 6/2011 |
| JP | 2011171697 A | 9/2011 |
| JP | 2011527113 A | 10/2011 |
| JP | 2014099668 A | 5/2014 |
| JP | 2015019002 A | 1/2015 |
| JP | 2016207802 A | 12/2016 |
| JP | 2017085013 A | 5/2017 |
| JP | 2019096772 A | 6/2019 |
| KR | 20140013618 A | 2/2014 |
| KR | 20180019226 A | 2/2018 |
| TW | 201810673 A | 3/2018 |
| TW | 201813016 A | 4/2018 |
| TW | 202013658 A | 4/2020 |
| WO | 2004075336 A1 | 9/2004 |
| WO | 2017029822 A1 | 2/2017 |
| WO | 2019132941 A1 | 7/2019 |

OTHER PUBLICATIONS

"Notification of Transmittal of the International Search Report and the Written Opinion of the International Searching Authority, or the Declaration for corresponding International Application No. PCT/US2022/023916, mailing date: Jun. 30, 2021, (13 pages)".

"Qin Zheng et al: "Electrical simulation of thin film inductors on silicon and glass substrates", 2014 Joint IEEE International Symposium, IEEE, May 12, 2014, pp. 555-559".

Notification of Transmittal of the International Search Report and the Written Opinion of the International Searching Authority, or the Declaration, in corresponding PCT Application No. PCT/US2021/024623 (Jul. 16, 2021).

Notification of Transmittal of the International Search Report and the Written Opinion of the International Searching Authority, or the

(56) References Cited

OTHER PUBLICATIONS

Declaration, in corresponding PCT Application No. PCT/US2021/021848 (Jun. 18, 2021).

* cited by examiner

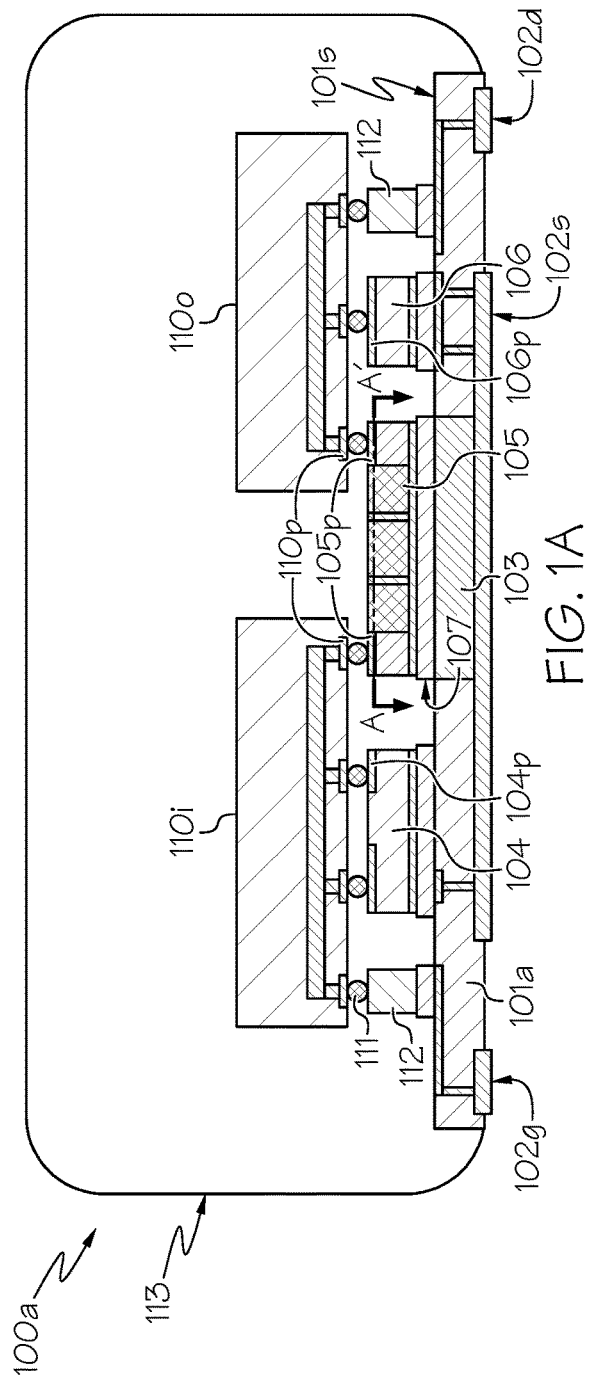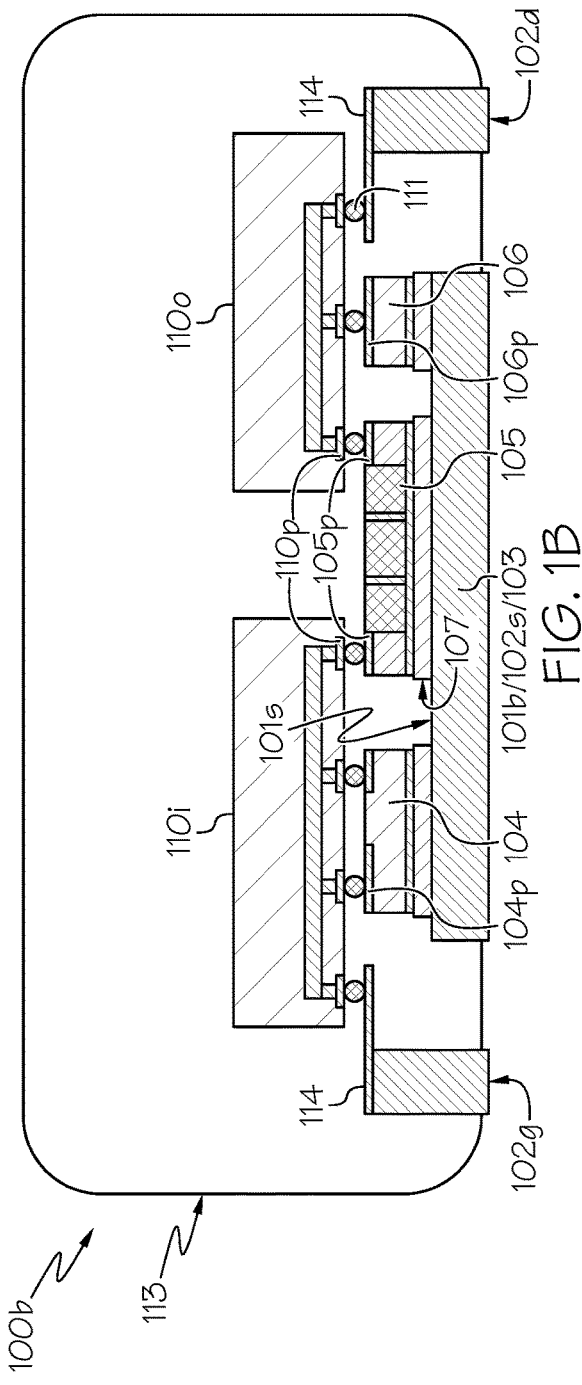
FIG. 1A
FIG. 1B

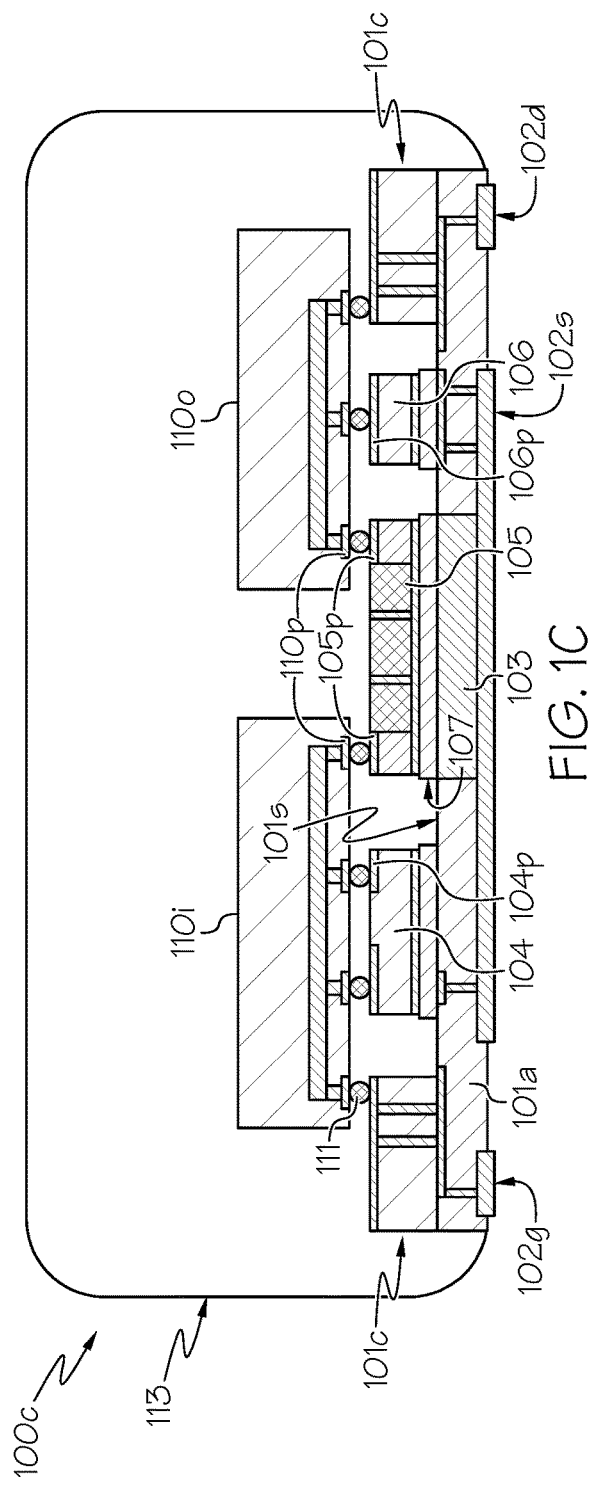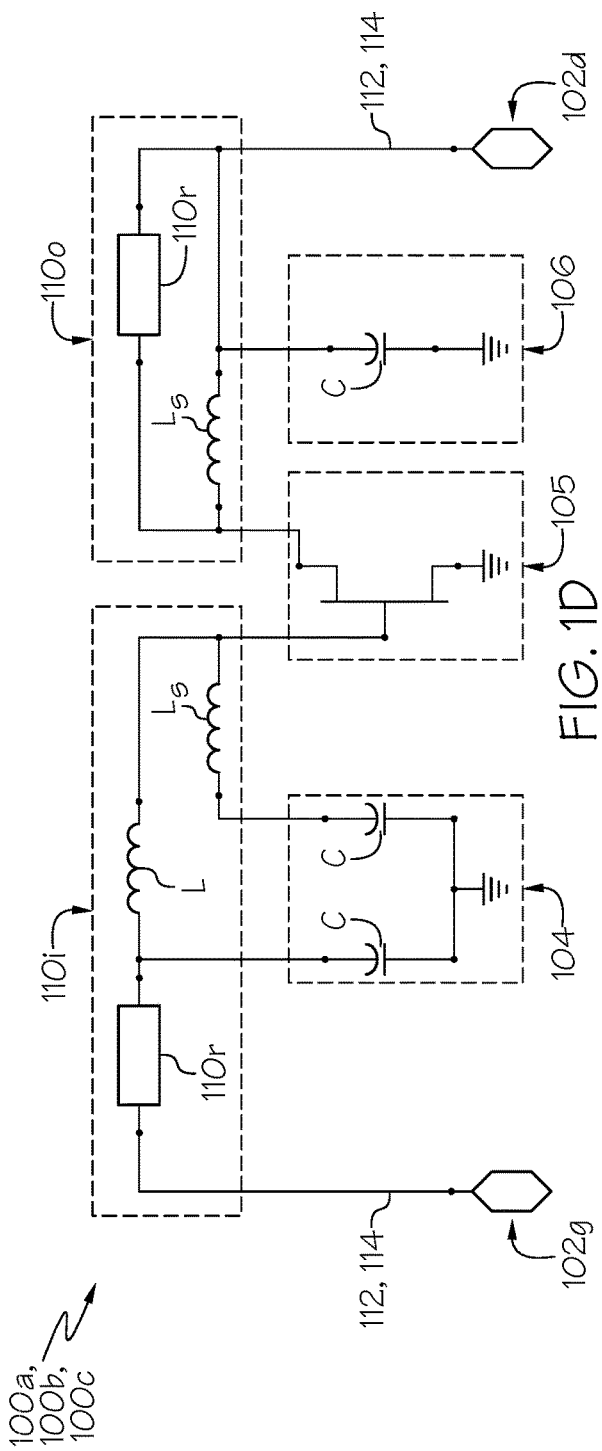

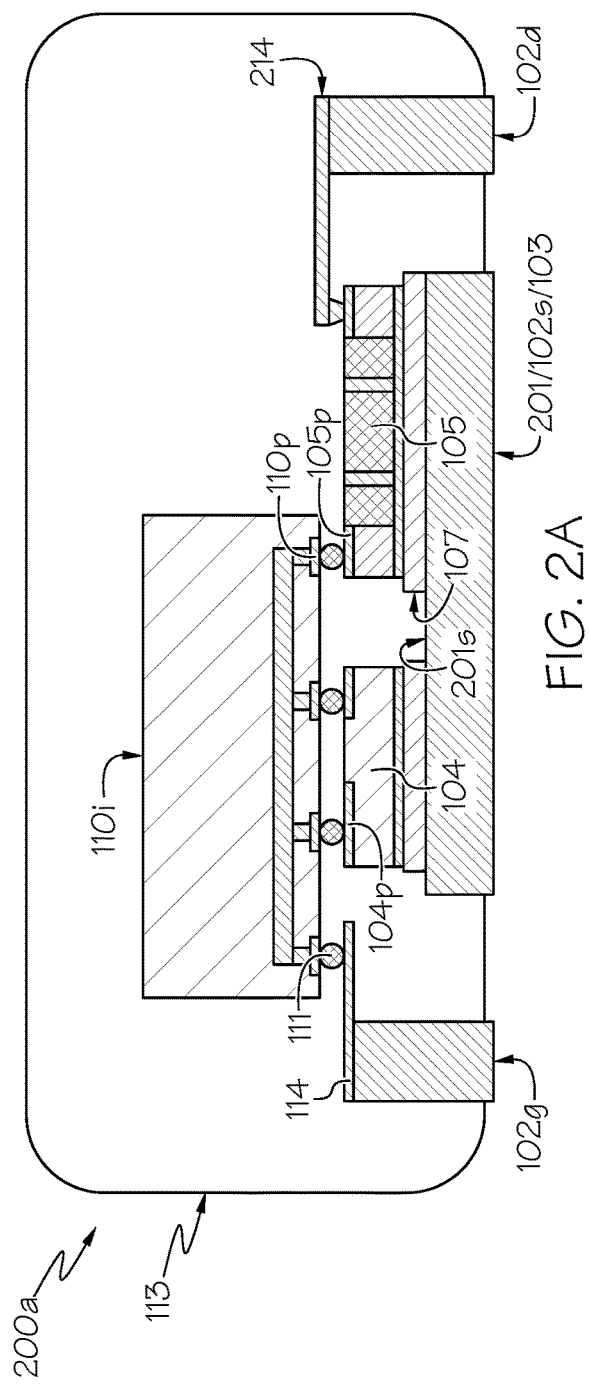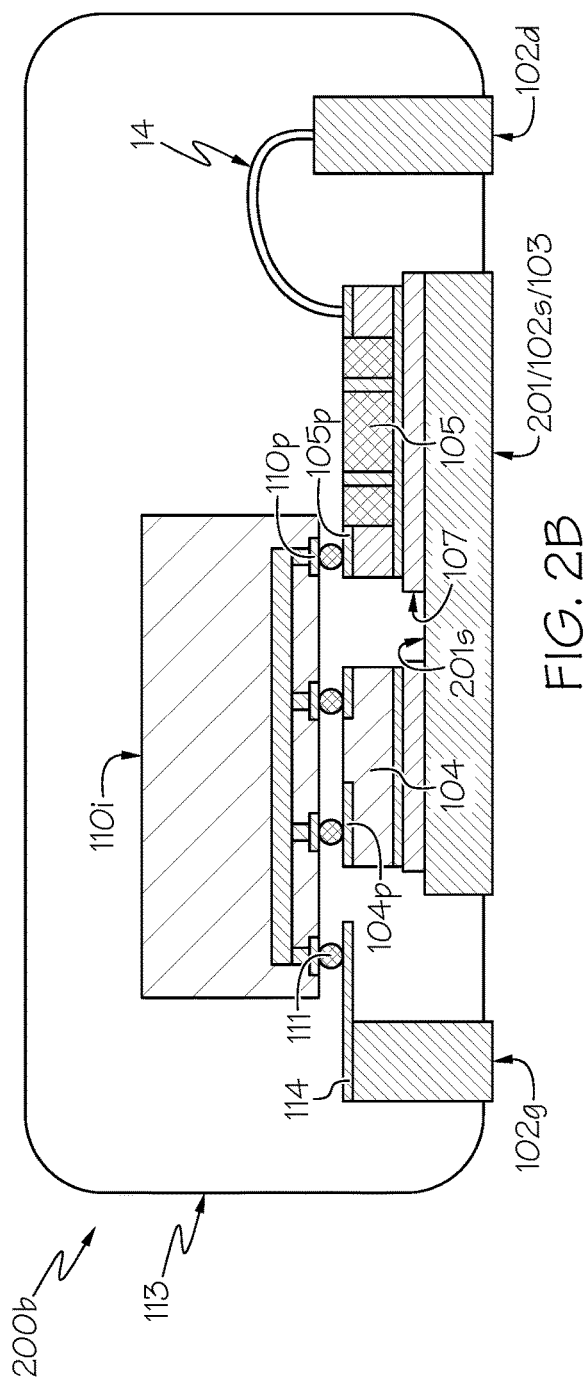
FIG. 2A
FIG. 2B

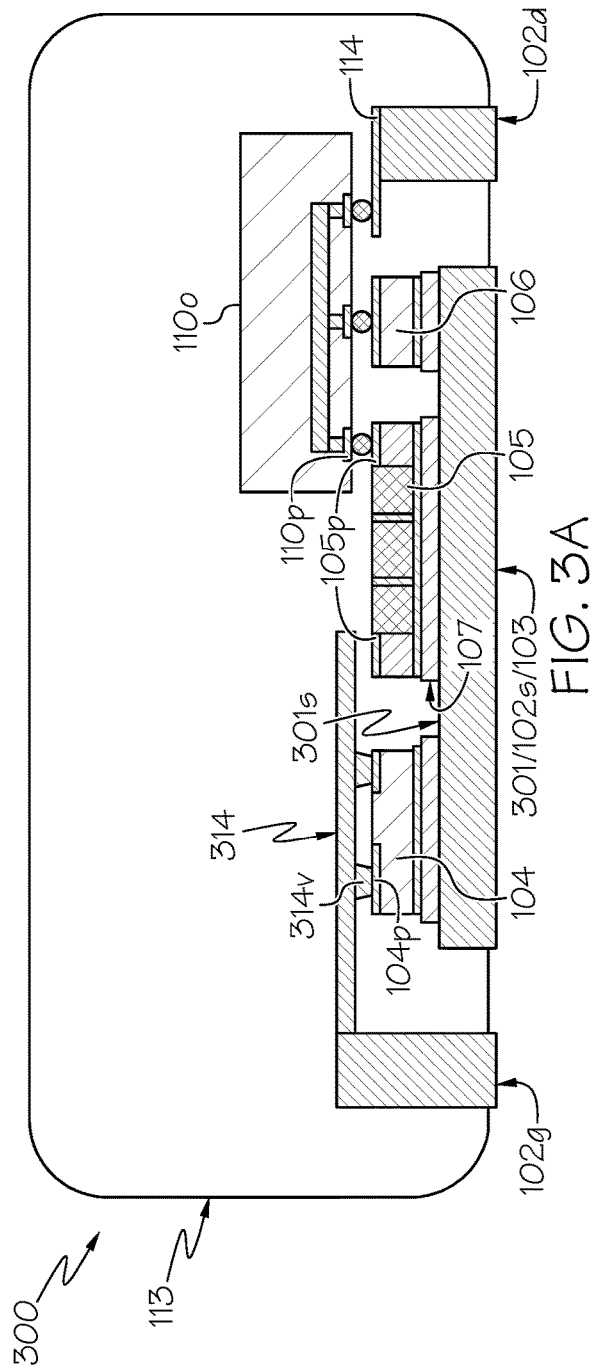
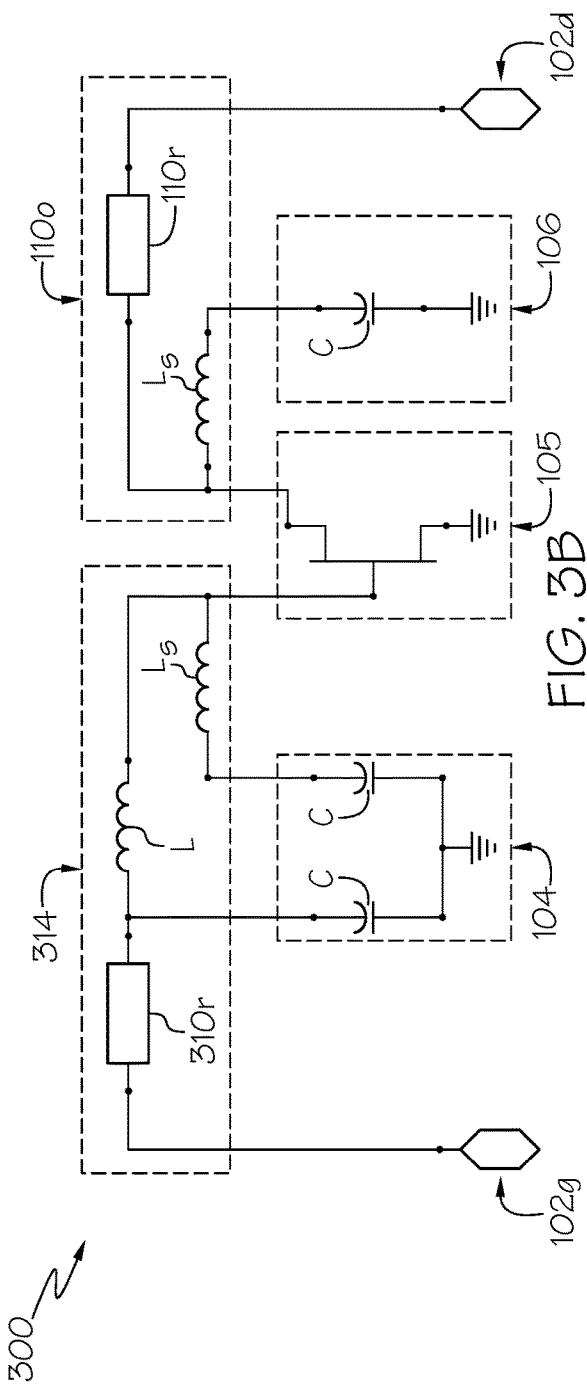
FIG. 3A
FIG. 3B

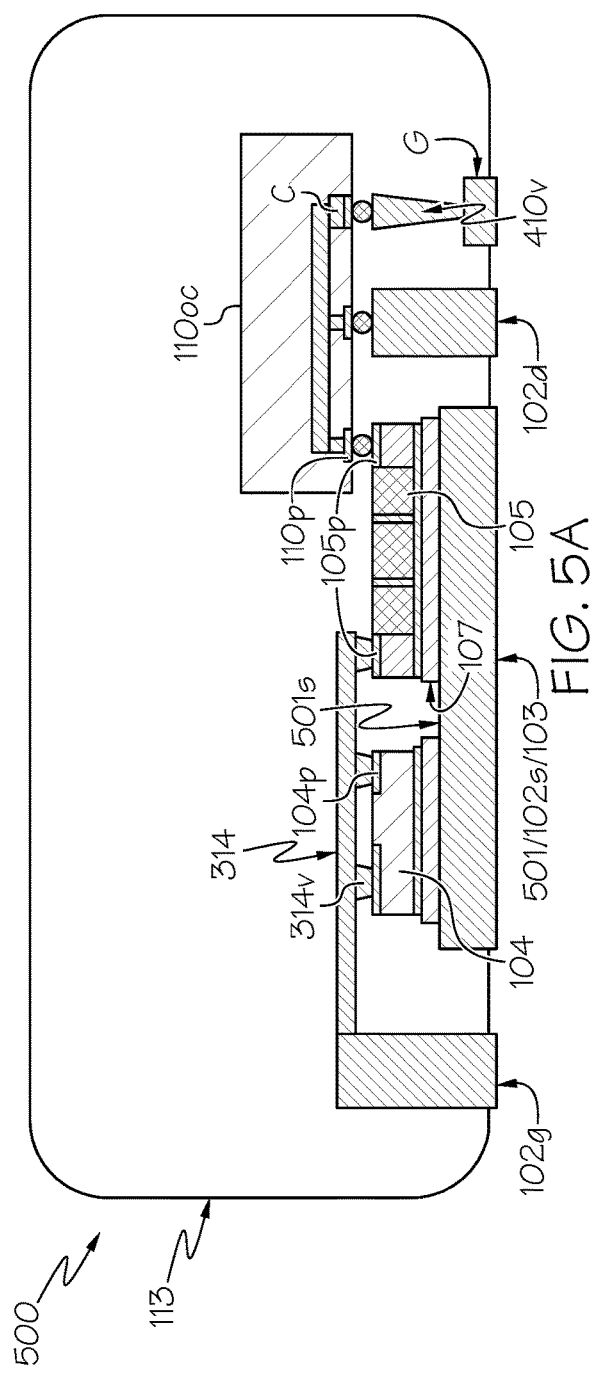
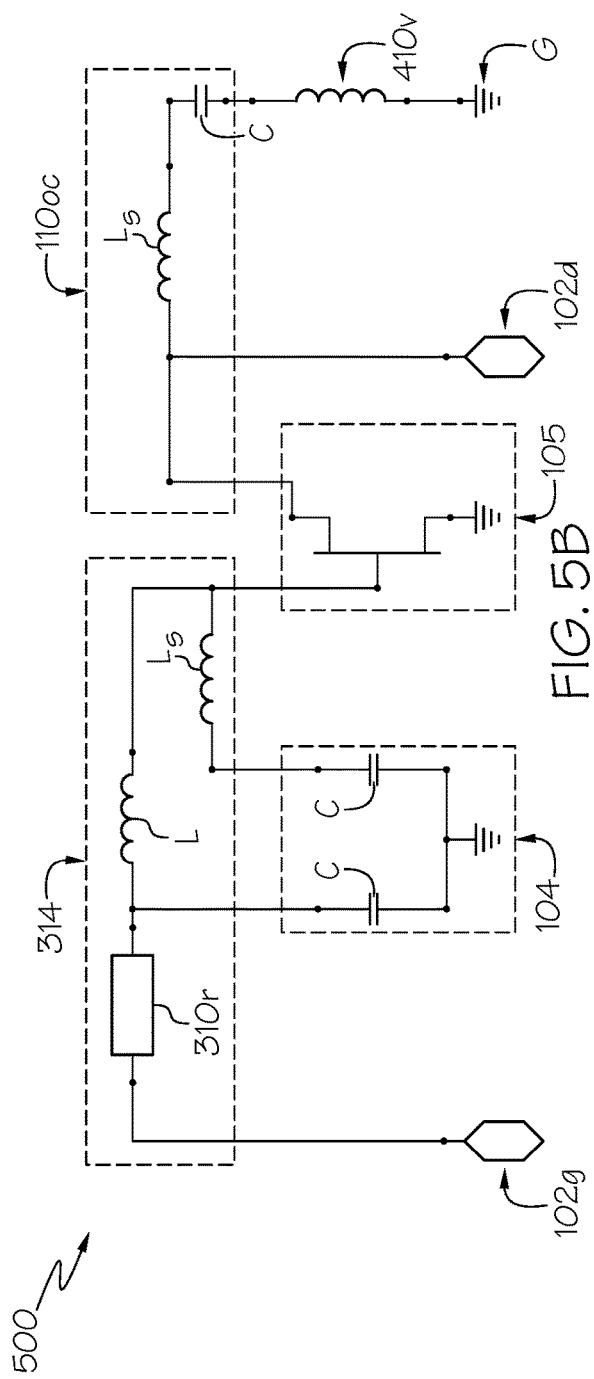
FIG. 5A
FIG. 5B

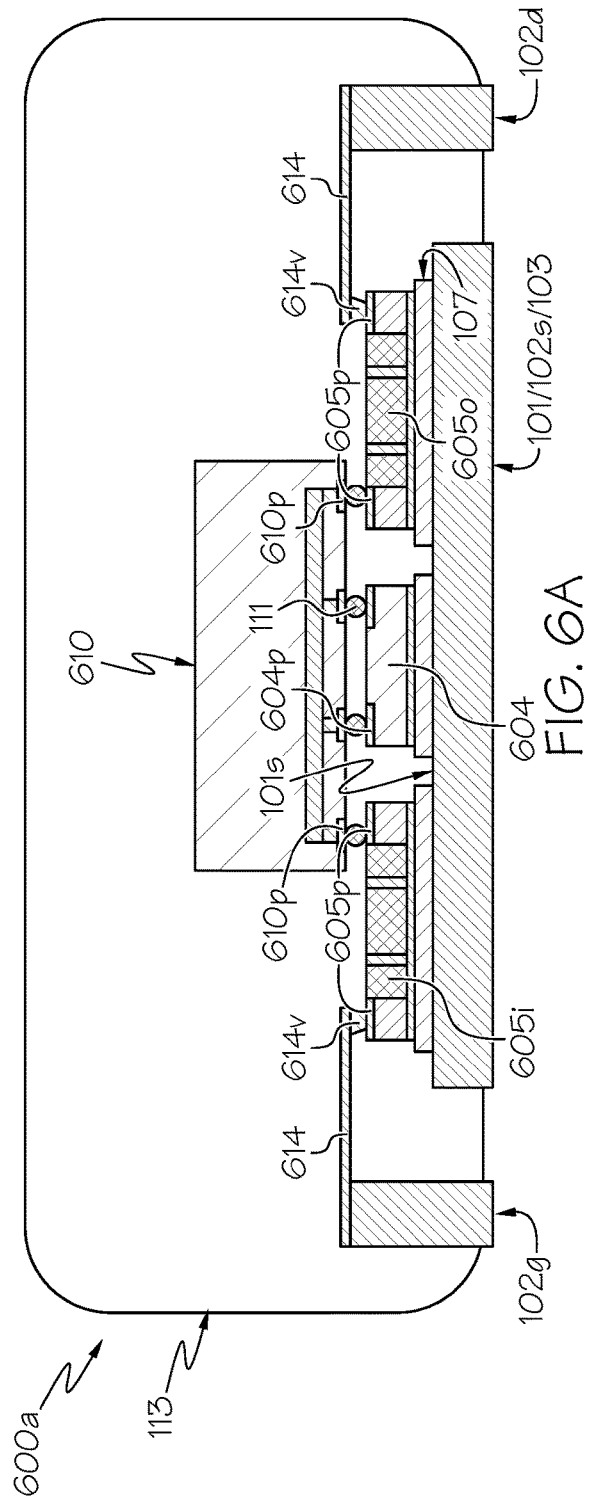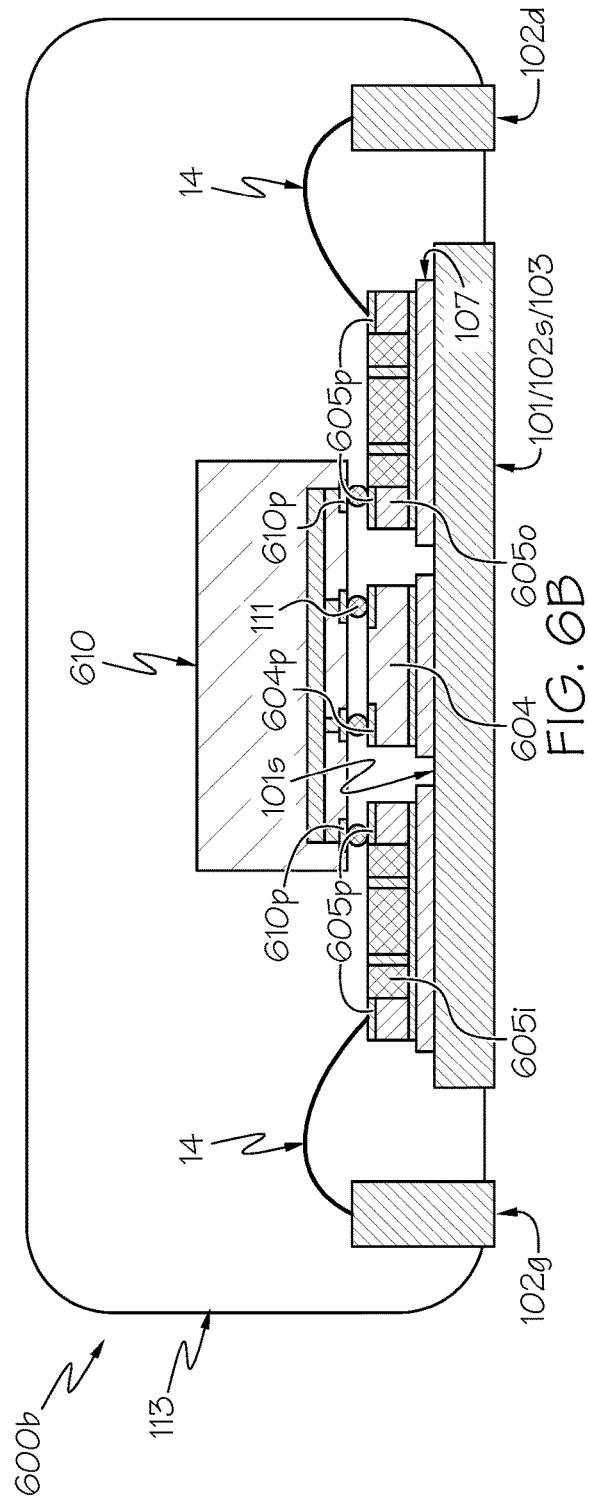

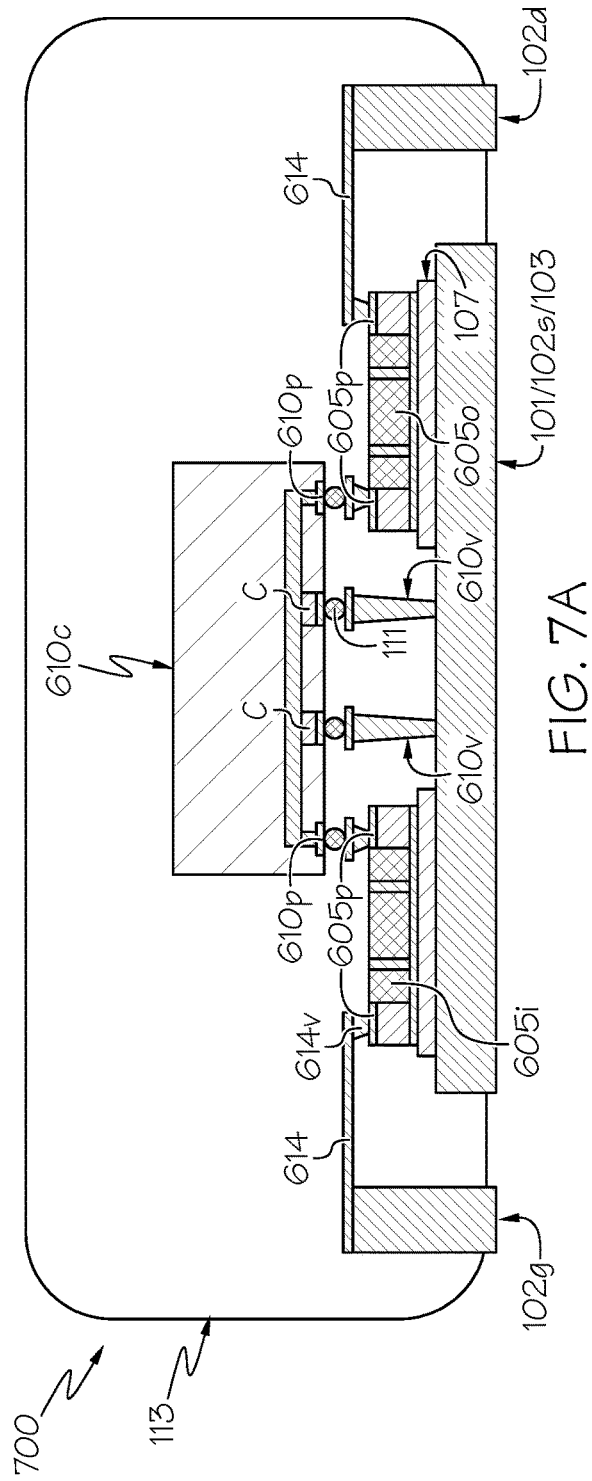
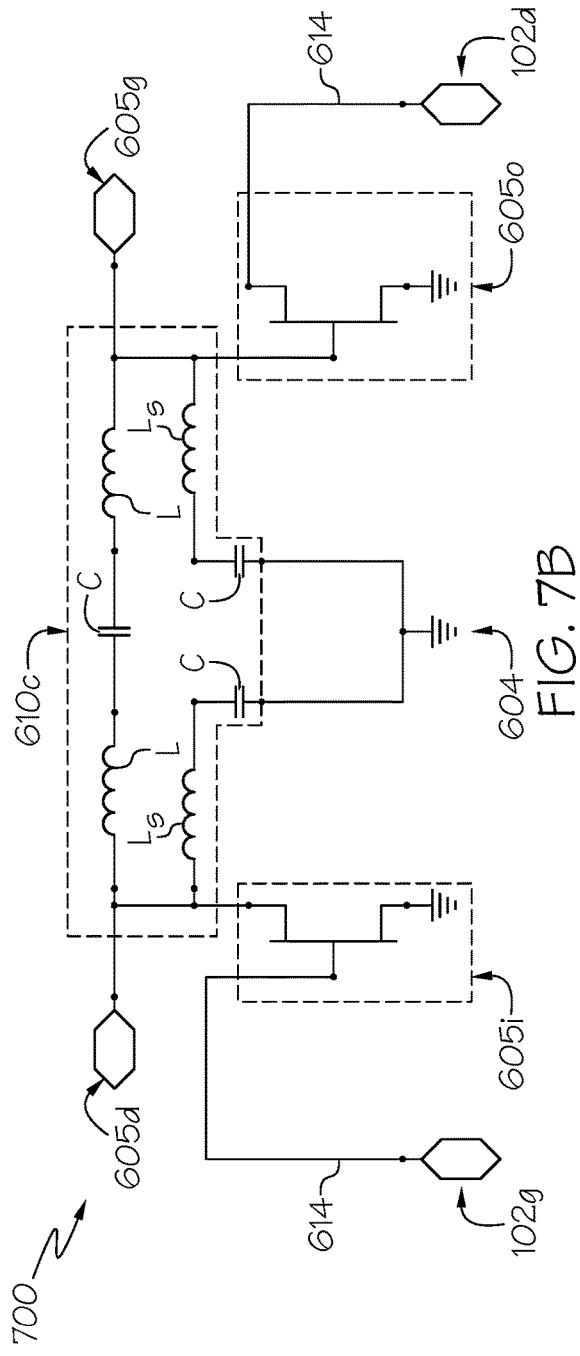
FIG. 7A
FIG. 7B

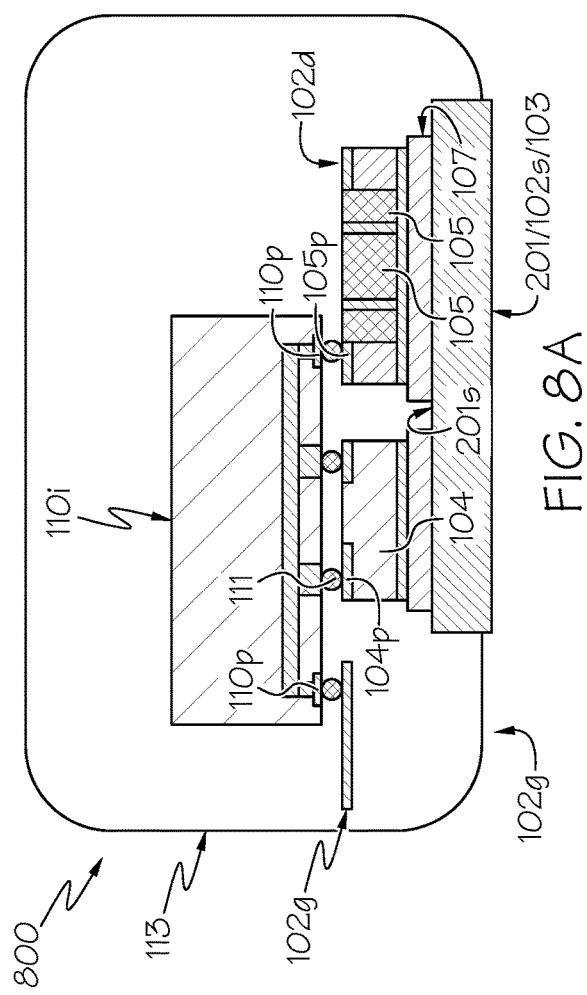
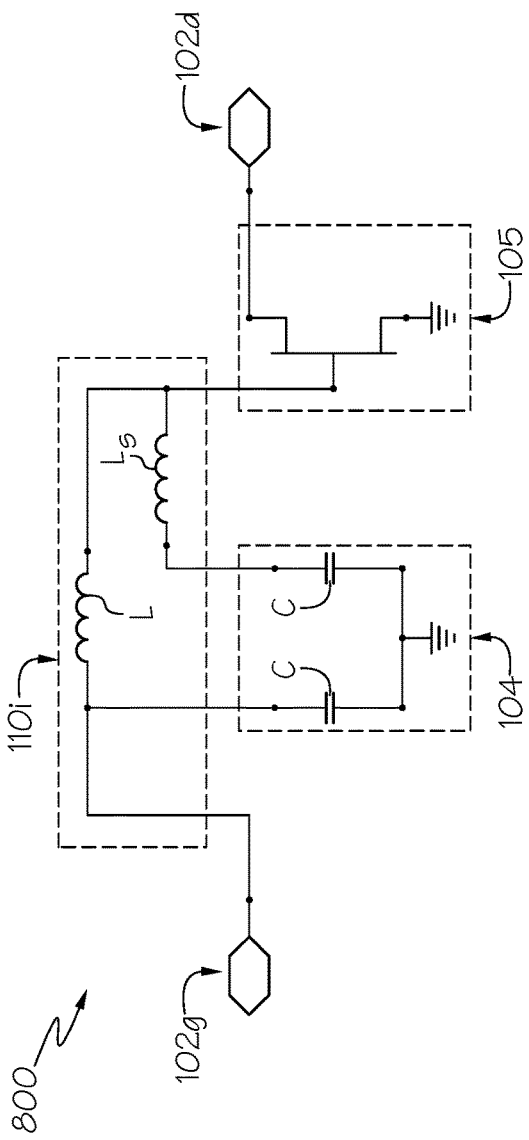
FIG. 8A
FIG. 8B

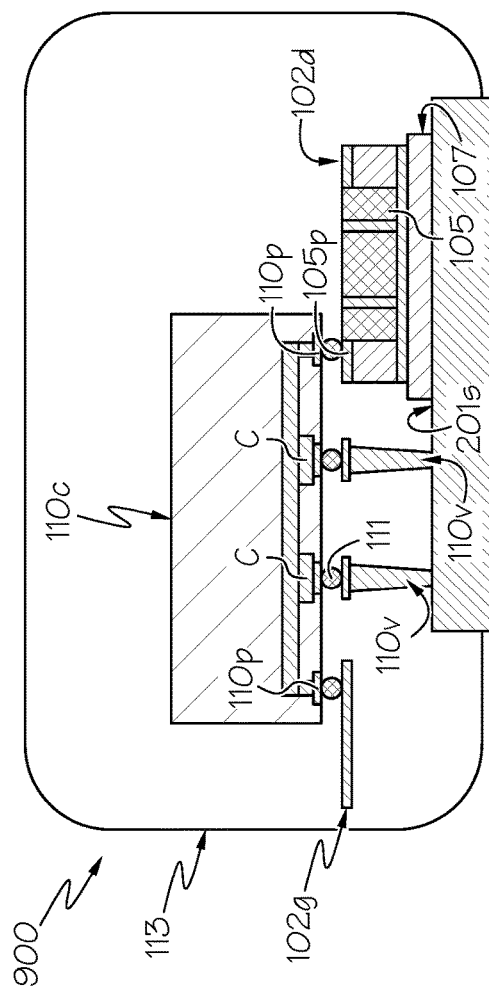
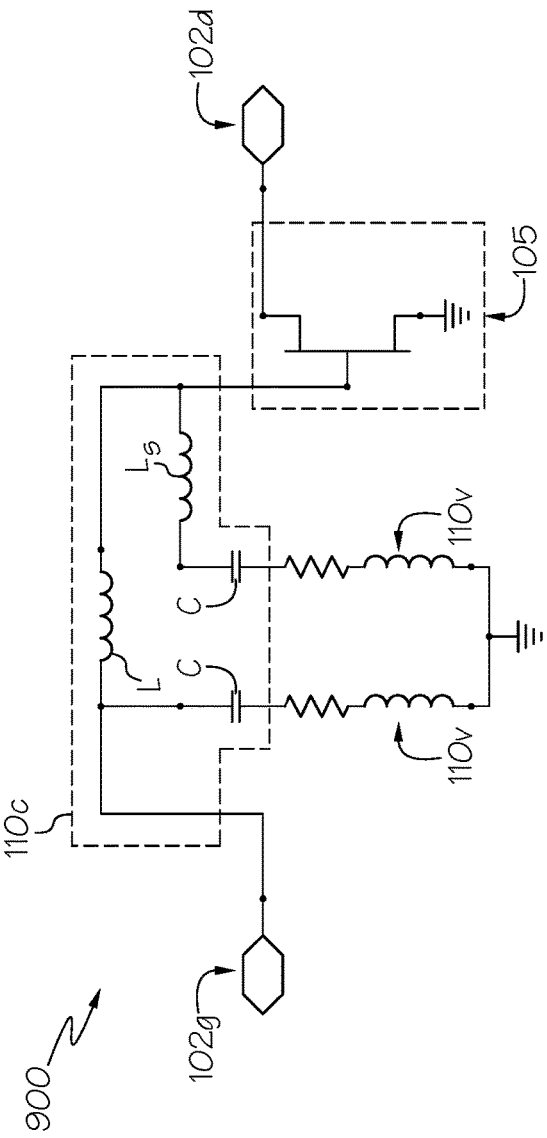
FIG. 9A
FIG. 9B

STACKED RF CIRCUIT TOPOLOGY

CLAIM OF PRIORITY

This application claims priority from U.S. Provisional Application No. 63/004,760 filed Apr. 3, 2020 with the United States Patent and Trademark Office, the disclosure of which is incorporated by reference herein.

FIELD

The present disclosure is directed to integrated circuit devices, and more particularly, to structures for integrated circuit device packaging.

BACKGROUND

RF power amplifiers are used in a variety of applications such as base stations for wireless communication systems, etc. The signals amplified by the RF power amplifiers often include signals that have a modulated carrier having frequencies in the megahertz (MHz) to gigahertz (GHz) range. The baseband signal that modulates the carrier is typically at a relatively lower frequency and, depending on the application, can be up to 300 MHz or higher. Many RF power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

RF amplifiers are typically formed as semiconductor integrated circuit chips. Most RF amplifiers are implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF amplifiers are typically implemented using LDMOS transistors, and can exhibit high levels of linearity with relatively inexpensive fabrication. Group III nitride-based RF amplifiers are typically implemented using HEMTs, primarily in applications requiring high power and/or high frequency operation where LDMOS transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation such as second and third order harmonic products. The termination of the harmonic products also influences generation of intermodulation distortion products.

The RF amplifier transistor die(s) as well as the impedance matching and harmonic termination circuits may be enclosed in a device package. A die or chip may refer to a small block of semiconducting material or other substrate on which electronic circuit elements are fabricated. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. Electrical leads may extend from the package to electrically connect the RF amplifier to external circuit elements such as input and output RF transmission lines and bias voltage sources.

Many functional blocks such as impedance matching circuits, harmonic filters, couplers, baluns, and power combiners/dividers can be realized by Integrated Passive Devices (IPDs). IPDs include passive electrical components and are generally fabricated using standard wafer fabrication technologies such as thin film and photolithography processing. IPDs can be designed as flip chip mountable or wire bondable components. The substrates for IPDs usually are thin film substrates like silicon, alumina, or glass, which may allow for ease in manufacturing and packaging with active transistor dies.

Some conventional methods for assembling RF power devices may involve assembling the transistor die and some of the matching network components (e.g., pre-match capacitors, such as MOS capacitors) in a ceramic or overmolded package on a CPC (copper, copper-molybdenum, copper laminate structure) or copper flange. The transistor die, capacitors, and input/output leads may be interconnected with wires, such as gold and/or aluminum wires. Such an assembly process may be slow and sequential (e.g., one package bonded at a time), and assembly costs may be high (e.g., due to cost of gold wires and expensive wire-bond machines).

SUMMARY

According to some embodiments of the present disclosure, an integrated circuit device package includes a substrate, a first die comprising active electronic components attached to the substrate, and at least one integrated interconnect structure on the first die opposite the substrate. The at least one integrated interconnect structure extends from the first die to an adjacent die attached to the substrate and/or toward at least one package lead and provides electrical connection therebetween.

In some embodiments, the electrical connection may be free of a wire bond.

In some embodiments, the first die may include a first bond pad, which is electrically connected to one or more of the active electronic components, on a surface of the first die opposite the substrate. The at least one integrated interconnect structure may include a contact pad that is on the first bond pad.

In some embodiments, the at least one integrated interconnect structure may be a conductive wiring pattern on a redistribution layer.

In some embodiments, the at least one integrated interconnect structure may include or provide at least a portion of an impedance matching network for a circuit defined by the active electronic components of the first die.

In some embodiments, the at least one integrated interconnect structure may be a passive device including one or more passive electronic components.

In some embodiments, the contact pad of the integrated interconnect structure may be a second bond pad, which is electrically connected to the one or more passive electronic components, on a surface of the passive device that is facing the surface of the first die. The second bond pad is connected to the first bond pad by a conductive bump therebetween.

In some embodiments, the active electronic components of the first die may define a first radio frequency (RF) amplifier circuit. The adjacent die may be a second active die including active electronic components that define a second RF amplifier circuit. The first and second power amplifier circuits may be connected in a multi-stage amplifier arrangement by the passive device.

In some embodiments, the passive device may be an integrated passive device (IPD) including at least one inductor.

In some embodiments, the IPD may be free of active electronic components.

In some embodiments, the IPD may include an insulating material between conductive elements thereof to define at least one capacitor integrated therein.

In some embodiments, the adjacent die may be a capacitor die including one or more capacitors and at least one capacitor bond pad that is on a surface of the adjacent die opposite the substrate. The contact pad of the at least one integrated interconnect structure may be a first contact pad, and the at least one integrated interconnect structure may further include at least one second contact pad that is on the at least one capacitor bond pad.

In some embodiments, the at least one package lead may be a gate lead and the first bond pad may be a gate pad. The adjacent die may be between the first die and the gate lead, and the impedance matching network may be an input impedance matching network for the circuit.

In some embodiments, the at least one package lead may be a drain lead and the first bond pad is may be drain pad. The adjacent die may be between the first die and the drain lead, and the impedance matching network may be an output impedance matching network for the circuit.

In some embodiments, the active electronic components may be power transistor devices. The first die may include a Group III-nitride and/or silicon carbide.

According to some embodiments of the present disclosure, a radio frequency (RF) power amplifier device package includes a substrate, a first die including a plurality of transistor cells that is attached to the substrate at a source pad on a bottom surface thereof and a gate or drain pad at a top surface thereof opposite the substrate, package leads configured to conduct electrical signals between the gate or drain pad of the first die and an external device, and an integrated interconnect structure on the first die opposite the substrate. The integrated interconnect structure includes a first contact pad on the gate or drain pad, and at least one second contact pad on an adjacent die attached to the substrate and/or coupled to one of the package leads.

In some embodiments, the integrated interconnect structure may provide electrical connection from the gate or drain pad of the first die to the adjacent die and/or to the one of the package leads. The electrical connection may be free of a wire bond.

In some embodiments, the integrated interconnect structure may be a conductive wiring pattern on a redistribution layer, or a passive device including one or more passive electronic components.

In some embodiments, the integrated interconnect structure may include or provide at least a portion of an impedance matching network for a circuit defined by the transistors of the first die.

In some embodiments, the first contact pad of the integrated interconnect structure may be a bond pad, which is electrically connected to the one or more passive electronic components, on a surface of the passive device that is facing the top surface of the first die. The bond pad may be connected to the gate or drain pad by a conductive bump therebetween.

In some embodiments, the adjacent die may include at least one bond pad on a surface thereof opposite the substrate. The at least one second contact pad of the integrated interconnect structure may be on the at least one bond pad. The adjacent die may be a capacitor die including one or more capacitors, or may be a second die including a plurality of transistor cells that define a stage of an RF amplifier circuit.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 1A, 1B, and 1C are cross-sectional views illustrating examples of integrated circuit device packages including stacked topology structures in accordance with some embodiments of the present disclosure.

FIG. 1D is an equivalent circuit diagram of the embodiments of FIGS. 1A, 1B, and 1C.

FIGS. 2A and 2B are cross-sectional views illustrating examples of integrated circuit device packages including stacked topology structures in accordance with some embodiments of the present disclosure.

FIG. 3A is a cross-sectional view illustrating an example of an integrated circuit device package including stacked topology structures in accordance with some embodiments of the present disclosure.

FIG. 3B is an equivalent circuit diagram of the embodiment of FIG. 3A.

FIG. 5A is a cross-sectional view illustrating an example of an integrated circuit device package including stacked topology structures in accordance with some embodiments of the present disclosure.

FIG. 5B an equivalent circuit diagram of the embodiment of FIG. 5A.

FIGS. 6A and 6B are cross-sectional views illustrating examples of integrated circuit device packages including stacked topology structures in accordance with some embodiments of the present disclosure.

FIG. 7A is a cross-sectional view illustrating an example of an integrated circuit device package including stacked topology structures in accordance with some embodiments of the present disclosure.

FIG. 7B is an equivalent circuit diagram of the embodiments of FIG. 7A.

FIGS. 8A and 9A are cross-sectional views illustrating examples of sub-components of integrated circuit device packages including stacked topology structures in accordance with some embodiments of the present disclosure.

FIGS. 8B and 9B are equivalent circuit diagrams of the embodiments of FIGS. 8A and 9A, respectively.

DETAILED DESCRIPTION

Figure 2C:
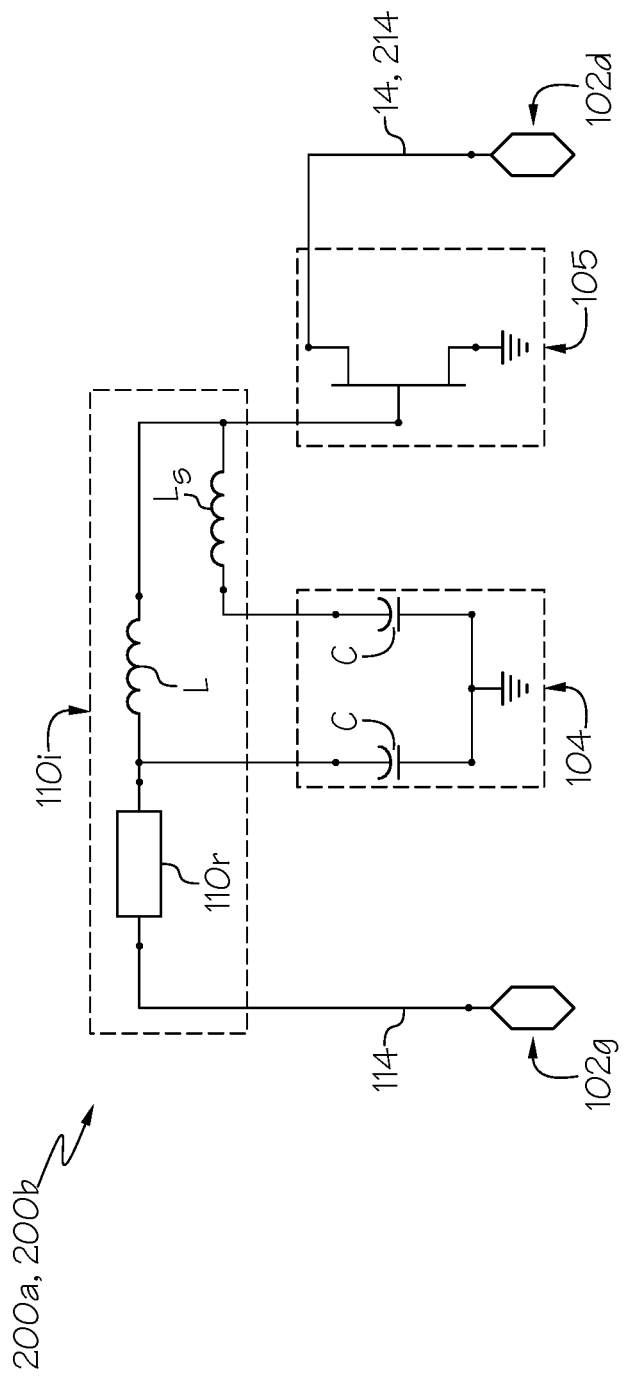
FIG. 2C is an equivalent circuit diagram of the embodiments of FIGS. 2A and 2B.

Some embodiments of the present disclosure may arise from difficulties in assembling and optimizing parameters of the various components included in an integrated circuit device package. For example, performance of some passive electronic components (e.g., inductors or capacitors) included in a die or IPD (generally referred to herein as a passive device or passive RF device), may be affected based on proximity to a ground plane. In particular, the quality factor Q of inductor coils may be reduced as a distance between the windings of the inductor coils and a ground-connected flange (or other grounded structure) is reduced. However, as dies are typically planar structures with only one surface providing conductive contact elements (also referred to herein as contact pads, bond pads, or pads) for electrical connections (typically by bondwires) to external dies or devices, increasing the distance between the passive components and the ground plane may increase the length of connections with one or more active electronic components (e.g., transistors, such as power transistor devices including transistor cells) included in an active transistor die (also referred to herein as a transistor die or active die). The increased connection lengths may reduce or negate the effectiveness of the impedance matching networks provided by the passive components, particularly at higher frequencies. Output pre-matching networks using a shunt inductor ("shunt-L") topology may be challenging (e.g., for GaN die products) because the long shunt-L bondwires may introduce more inductance than needed, degrading the quality of the impedance match (e.g., due in part to lower drain to source capacitance ($C_{ds}$)/watt in GaN), at about 50-70 fF/watt, which may likewise lead to higher losses and reduced performance. Coupling between input (e.g., gate) and output (e.g., drain) bond-wires may also lead to gain loss and instability.

In contrast to some conventional RF power devices that may use wire-bond loops to implement input and output pre-matching, embodiments of the present disclosure provide packaged RF power products for high power applications, in which connections between components (e.g., between circuit-level components, such as between the bond pads of one or more active transistor dies, and/or between the bond pads of active transistor dies and the gate and/or drain leads of the package) are implemented by one or more structures including conductive components on a layer or substrate, such as semiconductor chips or dies (e.g., one or more passive devices) without the use of wirebonds, generally referred to herein as integrated interconnect structures.

An integrated interconnect structure or device (or 'integrated interconnect') may generally refer to a structure that includes integrated circuitry such as resistors (including transmission lines), vias, inductors, and/or capacitors on a layer or substrate, for example, a dielectric base structure with integrated traces, vias and/or circuitry that can be used instead of bond wires to reduce and/or avoid related parasitic induction and manufacturing issues. Integrated interconnects may be implemented in some embodiments described herein as passive devices (including IPDs with thin film substrates such as silicon, alumina, or glass) and/or conductive wiring structures (including conductive wires on a redistribution layer (RDL) laminate structure or other substrate). As noted above, IPDs include inductors and/or other passive electrical components, and may be fabricated using standard semiconductor processing techniques such as thin film and/or photolithography processing. IPDs can be flip chip mountable or wire bondable components, and may include thin film substrates such as silicon, alumina, or glass. An RDL structure refers to a substrate or laminate that has conductive layer patterns and/or conductive vias. RDL structures may be fabricated using semiconductor processing techniques by depositing conductive and insulating layers and/or patterns on a base material and by forming vias and copper routing patterns within the structure for transmitting signals through the RDL structure.

Integrated interconnects may be used as described herein to provide connections to inputs, outputs, and/or between stages of transistor dies, as well as to provide circuits that may be useful and/or necessary for operation of the transistor die(s). For example, the integrated interconnects may provide an impedance that is configured to reduce an impedance mismatch between active transistors dies, and/or between an external device connected to the package leads. In particular examples, input and/or output pre-matching network circuits for an active transistor die can be implemented by integrated interconnects, such as IPDs, resulting in minimal or no wire-bonding. In some embodiments, flip-chip IPDs including respective contacts that face the respective contacts of the one or more transistor dies may be used to interconnect multiple transistor dies, for example, in multi-stage amplifier implementations. That is, in some embodiments, the integrated interconnects may provide both an interconnection function and an impedance matching/ harmonic termination function, such that the use of wire-bonds in the package can be reduced or eliminated. IPDs as described herein may be free of active components in some embodiments.

In some embodiments, the IPDs that provide the impedance matching networks for the active die (also referred to herein as pre-match IPDs) are placed or stacked directly on top of the gate and/or drain pads of the transistor die and/or capacitor chips, thus reducing or minimizing interconnect-related losses. The elevated height or increased distance (as provided by the stacked arrangement, for example, on top of a 100 μm thick active transistor die) between the passive components and an attachment surface, such as the ground-connected flange of a device package die pad or flange of the package, can reduce capacitive coupling to ground, thus reducing or minimizing negative effects on (and in some cases increasing) the quality factor Q (minimizing losses) of the passive components, and leading to better RF performance. Also, the thin, low-profile conductive traces in the integrated interconnects (e.g., the pre-match IPDs) may have lower coupling to output wires or traces.

Additional passive components (e.g., for particular applications) can be included in the passive device and/or on the attachment surface of the package directly beneath the passive device. For example, in some embodiments, capacitors for pre-matching and/or harmonic termination (e.g., MOS capacitors) can be placed between the input pre-match IPD and the attachment surface. Similarly, high density output capacitors can be placed between the output pre-match IPD and the attachment surface for improved video bandwidth (VBW), providing a larger area for use in housing the high-density VBW capacitors. In some embodiments, the passive device may include capacitors integrated therein, such as MIM (metal-insulator-metal) capacitors.

Embodiments of the present disclosure can thus use stacked chip topologies to greatly reduce problems of coupling between gate and drain bond-wires, which can lead to gain loss and instability. In some embodiments, gate and/or drain bond-wires can be eliminated or reduced, and the low-profile conductive traces in the integrated interconnects (e.g., the input and/or output IPDs) may provide little coupling therebetween and/or lower coupling to output wires or traces. Also, by implementing the shunt-L and series connecting inductance in a high-Q flip-chip IPD, the required inductance can be achieved in a smaller area, and with manageable losses.

Embodiments of the present disclosure can be used in RF power products for 5G and base-station applications, as well as in radar and/or monolithic microwave integrated circuit ("MMIC") type applications. For example, Group III nitride-based RF amplifiers may be implemented as MMIC devices in which one or more transistor dies are implemented together with their associated impedance matching and harmonic termination circuits in a single, integrated circuit die.

FIG. 1A is a cross-sectional view illustrating an example of an integrated circuit device package including stacked topology structures in accordance with some embodiments of the present disclosure. As shown in FIG. 1A, some embodiments of the present disclosure provide an RF power device package 100a, which includes an active die 105 and integrated interconnects (illustrated as passive devices 110i, 110o; collectively 110) assembled on a package substrate 101a. In the example of FIG. 1A, the substrate 101a is a redistribution layer (RDL) laminate structure. The RDL 101a may include conductive layers fabricated using semiconductor processing techniques. However, it will be understood that the substrate 101a is not so limited: for example, the substrate 101a may be a printed circuit board (e.g., a multi-layer printed circuit board with metal traces), a ceramic substrate that includes conductive vias and/or conductive pads or any other suitable mounting surface for the active die 105. The bottom surface or bottom side of the RDL 101a includes package leads (in particular, gate 102g, drain 102d, and source 102s leads, collectively package leads 102) that conduct electrical signals between components on an attachment surface 101s of the RDL 101a and an external device (not shown), such as an external circuit board. The attachment surface 101s may include one or more conductive die pads, which in some embodiments may provide an electrical ground for the components of the package 100. The RDL 101a includes vias and multi-layer copper routing for transmitting signals from the leads 102 to passive electronic components (such as capacitor chips including one or more MOS capacitors 104 or high density capacitors 106) and active electronic components (such as transistors) of the active transistor die 105. For example, the active die 105 may include power transistor devices, e.g., defining an RF power amplifier. In some embodiments, the active die 105 may include discrete multi-stage, MMIC, and/or multi-path (e.g., Doherty) transistor devices.

The active transistor dies described herein may be implemented in silicon or using wide bandgap semiconductor materials, such as silicon carbide ("SiC") and Group III nitride materials. In particular embodiments, the active dies may be Group III nitride-based, such as gallium nitride (GaN), and/or silicon carbide (SiC)-based, including unit cell transistors that are connected in parallel in an upper portion of a semiconductor layer structure. The term "semiconductor layer structure" may refer to a structure that includes one or more semiconductor layers, such as semiconductor substrates and/or semiconductor epitaxial layers. In the illustrated embodiments, the active transistor die includes a gate pad and/or drain pad on an upper surface, and a source pad on a lower surface of the semiconductor layer structure that is adjacent the attachment surface. It will be understood, however, that this die configuration is illustrated herein by way of example only, and that embodiments and/or topologies described herein can be used with die configurations other than those specifically illustrated.

As RF amplifiers are often used in high power and/or high frequency applications, high levels of heat may be generated within the transistor die(s) during operation. If the transistor die(s) become too hot, the performance (e.g., output power, efficiency, linearity, gain, etc.) of the RF amplifier may deteriorate and/or the transistor die(s) may be damaged. As such, RF amplifiers are typically mounted in packages that may be optimized or otherwise configured for heat removal. In the example of FIG. 1A, the source lead 102s includes or is attached to a conductive structure 103 (illustrated as an embedded conductive slug or via) that provides thermal conductivity (e.g., a heat sink). In particular, a section of the RDL 101a underneath the transistor die 105 may be filled (e.g., greater than about 85% filled, fully filled, or almost fully filled) with a high-density conductive array 103 of copper vias for transmitting heat away from the transistors of the transistor die 105. The conductive structure 103 may also be filled with an embedded copper slug or coin for example, in an embedded packaging process. The transistor die 105 and capacitor chips 104, 106 are attached to the attachment surface 101s of the RDL 101a with die-attach materials 107 and techniques, such as eutectic materials, precoat (e.g., AuSn precoat), pre-forms, sintering (e.g., Ag-sintering), etc.

Still referring to FIG. 1A, one or more connections between the active transistor die 105 (in particular, between contacts or bond pads 105p on a top side or surface of the transistor die 105) and the package leads 102 are implemented by respective integrated interconnects, in this example passive devices implemented by IPDs 110i and 110o, without wire bonds therebetween. The connections provided by the passive devices 110 are opposite to (rather than in) the attachment surface 101s or substrate 101a, to which the bottom side or surface of the active die 105 is attached. More particularly, the bond pads 105p on a surface of the transistor die 105 opposite the substrate 101 are connected to bond pads 110p on a surface of the IPDs 110 facing the transistor die 105, and the bond pads 110p of the IPDs are connected to the package leads 102. As noted above, the passive device(s) 110 may include passive electronic components such as resistors/transmission lines, inductors, and/or capacitors on a semiconductor or other substrate.

In FIG. 1A, the components of the passive devices 110 are configured to provide input 110i and output 110o impedance matching networks for a circuit (e.g., an RF amplifier circuit) defined by transistors of the active die 105, and are illustrated as high-Q IPDs, but passive devices as described herein are not limited thereto. The input impedance matching circuits may match the impedance of the fundamental component of RF signals input to the RF power device package 100a to the impedance at the input of the active die 105, the output impedance matching circuits may match the impedance of the fundamental component of RF signals that are output from the RF power device package 100a to the impedance of the circuitry connected to the output of the active die 105, and input and/or output harmonic termination circuits are configured to short to ground harmonics of the fundamental RF signal that may be present at the input and/or output of the active die 105.

In the example of FIG. 1A, the high-Q IPDs 110 for the input and output pre-matching networks are flip-chip devices including respective bond pads 110p on a surface of the IPDs 110. The IPDs 110 are thus 'flip-chipped' on top of the transistor die 105 and capacitor chips 104, 106, such that the bond pads 110p on surfaces of the IPDs 110 are aligned with bond pads 105p and 104p, 106p on surfaces of the transistor die 105 and the capacitor chips 104, 106, respectively, that are facing the surface of the IPDs 110. The IPDs 110 may include conductive bumps 111 (e.g., conductive epoxy patterns or solder bumps, in some embodiments pre-attached to the IPDs 110) for connecting the bond pads 110p to the bond pads 105p and 104p, 106p. The top surfaces of the capacitor chips 104, 106 and transistor die 105 can be aligned to the same height by grinding the wafers (for the die or capacitor chips), and/or or by using pre-forms 107 of different thicknesses to align the heights of the elements 104, 105, and 106. As such, the package 100a includes a stacked structure with elements 104, 105, and 106 attached to the attachment surface 101s (which may provide electrical connection to ground) between the substrate 101a and the elements 110. The elements 110 provide electrical connections between the elements 104, 105, and 106 and the leads 102 opposite to the substrate 101a, and without respective bond wires extending between the elements 104, 105, and 106 and the leads 102.

A copper shim 112 attached to the RDL 101a can be used for routing the signal from the IPDs 110 to the RDL 101a and to the gate and drain leads 102g and 102d of the package 100a. In some embodiments, additional IPDs including vias (e.g., through silicon vias (TSVs)) can be used in place of the copper shim 112 to connect the IPDs 110 to the gate and drain leads 102g and 102d.

A packaging material (illustrated as a plastic over mold (OMP) 113) encapsulates or otherwise provides protection for the dies 105, 110 while providing access to the leads 102 for connection to circuits or devices that are external to the package 100a, generally referred to herein as external devices. The over-mold 113 may substantially surround the dies 105, 110, and may be formed of a plastic or a plastic polymer compound, thereby providing protection from the outside environment. Advantages of the over mold type package include reduced overall height or thickness of the package, and design flexibility for the arrangement of and/or spacing between the leads 102. In some embodiments, over mold-type packages as described herein may have a height or OMP thickness of about 400 micrometers (μm) to about 700 μm. In other embodiments, the dies 105, 110 may be included in an open cavity package (e.g., a thermally enhanced package (TEPAC or T3PAC)), including ceramic materials, that defines a cavity surrounding the dies 105, 110 and may have a height or thickness of about 1400 micrometers (μm) to about 1700 μm.

FIG. 1B is a cross-sectional view illustrating another example of an integrated circuit device package including stacked topology structures in accordance with some embodiments of the present disclosure. As shown in FIG. 1B, an RF power device package 100b includes active and passive devices 105, 110 assembled on a substrate 101b. The package 100b includes components and connections as in the embodiment shown in FIG. 1A, but the substrate 101b is a conductive structure 103 (e.g., a copper slug) that provides the attachment surface 101s, the source lead 102s, and thermal conductivity (e.g., a heat sink) for transmitting heat away from the transistors of the transistor die 105. Also, in comparison to FIG. 1A, the bond pads 110p of the passive devices 110 are connected to the package leads 102 by an integrated interconnect (illustrated as conductive wiring structures 114, e.g., including a copper routing layer in a RDL), instead of the copper shims 112 (or IPD with TSVs). Alternatively, the bond pads 110p of the passive devices 110 can be directly connected to the package leads 102 (e.g., by respective solder bumps 111) in some embodiments, without the conductive wiring structures 114 therebetween. The embodiment of FIG. 1B may be described as lead-frame based, in comparison to the laminate based embodiment of FIG. 1A.

FIG. 1C is a cross-sectional view illustrating another example of an integrated circuit device package including stacked topology structures in accordance with some embodiments of the present disclosure. As shown in FIG. 1C, an RF power device package 100c is similar to the embodiment of FIG. 1A, but instead of the copper shims 112 (or IPD with TSVs), the package 100c includes second RDL layers 101c attached on top of the first RDL layer 101a, opposite the gate lead 102g and/or opposite the drain lead 102d. The height or thickness of the second RDL layer 101c is selected or configured to provide a contact surface that is aligned or coplanar with the bump pads 105p, 104p of the transistor die 105 and MOS capacitor chip 104 at the input side, and likewise, aligned or coplanar with the bump pads 105p, 106p of the transistor die 105 and VBW capacitor chip 106 at the output side. As such, the input 110i and output 110o flip-chip IPDs can be placed on substantially coplanar surfaces provided by the second RDL layer 101b to interconnect the gate and drain pads 105p of the transistor die 105 with the gate lead 102g and drain lead 102d (and/or with the MOS capacitors 104 and VBW capacitors 106). Additional second RDL layers 101c and/or other intermediate substrates, while not illustrated, may also be provided between the attachment surface 101s and the passive device (s) 110 to provide the desired clearance or alignment between contact pads of components of different heights or thicknesses.

FIG. 1D is an equivalent circuit diagram of the embodiments in FIGS. 1A, 1B, and 1C. The input pre-matching network is implemented by the high-Q IPD 110i and the input capacitors 104 to provide an L-C matching circuit (e.g., a low-pass L-C) at the fundamental frequency f0, as well as a shunt-L inductance Ls matching circuit (e.g., a high-pass Ls) for optimum termination of the harmonic frequencies (e.g., 2f0). The output pre-matching network is implemented by the output capacitors 106 and the high-Q IPD 110 to provide a shunt-L inductance Ls matching circuit (e.g., a high-pass Ls) for pre-matching the fundamental frequency f0. The series transmission lines 110r in each of the input 110i and output 110o IPDs can be selected to provide appropriate impedance transformation from the transistor die 105 to the gate 102g or drain 102d leads. The series transmission lines (e.g., as provided by conductive structures 110r) can be treated as an extension of the board transmission line matching network, and electrical widths can be selected or configured to achieve the desired characteristic impedance for the impedance matching.

FIGS. 2A and 2B are cross-sectional views illustrating examples of integrated circuit device packages including stacked topology structures in accordance with some embodiments of the present disclosure. As shown in FIGS. 2A and 2B, RF power device package 200a and 200b each includes an active die 105 and an integrated interconnect (illustrated as an IPD or other passive device 110i) assembled on a package substrate 201. The packages 200a and 200b include components and connections as in the embodiment shown in FIG. 1B, with the substrate 201 implemented as a conductive structure 103 (e.g., a copper slug) that provides the attachment surface 201s, the source lead 102s, and thermal conductivity (e.g., a heat sink) for transmitting heat away from the transistors of the transistor die 105. In the embodiments of FIGS. 2A and 2B, the passive device 110 is used only at the input side of the package 200a, 200b. For example, for implementations with smaller die periphery (e.g., less than about 16 mm total gate width) and/or lower frequency operation (e.g., less than about 2.4 GHz), the output impedance of the transistor die 105 may be sufficiently high to be matched to 50 ohms with an RF circuit board, such that an in-package output pre-matching network may not be needed. As only an input pre-matching network may be required in such implementations, the input of the transistor die 105 is electrically connected to the gate lead 102g by the IPD 110i and the MOS capacitors 104 defining the pre-matching network.

More particularly, the bond pads 105p and 104p on top surfaces of the transistor die 105 and the MOS capacitor chips 104 are connected to bond pads 110p on a facing surface of the IPD 110i by respective solder bumps 111, without wire bonds therebetween. The bond pads 110p of the IPD 110i are connected to the gate lead 102g by conductive wiring structures 114, for example a copper routing layer in a RDL. Alternatively, the bond pads 110p of the passive device 110i can be directly connected to the gate lead 102g, without the conductive wiring structures 114 therebetween. The output of the transistor die 105 is connected directly to the drain lead 102d by conductive wiring structures (illustrated as a copper routing layer in a RDL 214 in FIG. 2A or as a wire-bond 14 in FIG. 2B.

FIG. 2C is an equivalent circuit diagram representing the embodiments of FIGS. 2A and 2B. Similar to the input side in the embodiments of FIGS. 1A and 1B, the input pre-matching network is implemented by the high-Q IPD 110i and the input capacitors 104 to provide an L-C matching circuit (e.g., a low-pass L-C) at the fundamental frequency f0, as well as a shunt-L inductance Ls matching circuit (e.g., a high-pass Ls) for optimum termination of one or more harmonic frequencies (e.g., 2f0). The series transmission line 110r in the input 110i IPD can be selected to provide appropriate impedance transformation from the transistor die 105 to the gate lead 102g. Electrical width of the transmission line 110r may also be configured to achieve the desired characteristic impedance for the impedance matching.

FIG. 3A is a cross-sectional view illustrating an example of an integrated circuit device package including stacked topology structures in accordance with some embodiments of the present disclosure. As shown in FIG. 3A, RF power device package 300 includes an active die 105 and an integrated interconnect (illustrated as an IPD or other passive device 110o) assembled on a package substrate 301. As in the embodiment of FIG. 1B, the substrate 301 is a conductive structure 103 (e.g., a copper slug) that provides the attachment surface 301s, the source lead 102s, and thermal conductivity (e.g., a heat sink) for transmitting heat away from the transistors of the transistor die 105. In the embodiments of FIG. 3A, the passive device 110o that provides electrical connections to the active die 105 and the capacitor chip 106 is provided only at the output side of the package 300. More particularly, the bond pads 105p and 106p of the transistor die 105 and the high density capacitor chip 106 are connected to bond pads 110p of the IPD 110o by respective conductive bumps 111, without wire bonds therebetween. The bond pads 110p of the IPD 110o are connected to the drain lead 102d by conductive wiring structures 114, for example a copper routing layer in a RDL. Alternatively, the bond pads 110p of the passive device 110o can be directly connected to the drain lead 102d, without the conductive wiring structures 114 therebetween.

Still referring to FIG. 3A, the connections between the gate lead 102g, the capacitor chip 104, and the input of the transistor die 105 are implemented by integrated interconnects in the form of conductive wiring structures 314, illustrated as a RDL including a copper (or other conductive) routing layer and a contact pad, illustrated by way of example as a conductive via or post 314v. More particularly, in the example of FIG. 3A, the inductance for the input pre-matching network and harmonic termination is implemented directly in the copper trace and vias of the RDL 314, and the input IPD 110i is omitted. The inductance for the impedance matching can be achieved in the conductive wiring structure 314, for example, using narrow strips of copper routing or coil tracing, and can be connected to the bond pads 105p and 104p of the transistor die 105 and input capacitor chip 104 using conductive vias 314v. For example, narrow copper traces (e.g., about 10 microns in width) and vias can be deposited using modern embedded packaging assembly techniques to collectively provide the RDL 314 with the required or desired inductance in some embodiments. However, the tolerance of the trace width and/or spacing of the traces and/or vias of the RDL 314 may be less controllable as compared to an IPD 110.

FIG. 3B is an equivalent circuit diagram representing the embodiment of FIG. 3A. Similar to the output side in the embodiments of FIGS. 1A and 1B, the output pre-matching network is implemented by the output capacitors 106 and the high-Q IPD 110o to provide a shunt-L inductance Ls matching circuit (e.g., a high-pass Ls) for pre-matching the fundamental frequency f0. The series transmission line 110r in the output IPD 110o can be selected to provide appropriate impedance transformation from the transistor die 105 to the drain 102d lead. The input pre-matching network is implemented by the conductive wiring structure 314 and the input capacitors 104 to provide an L-C matching circuit (e.g., a low-pass L-C) at the fundamental frequency f0, as well as a shunt-L inductance Ls matching circuit (e.g., a high-pass Ls) for optimum termination of one or more harmonic frequencies (e.g., 2f0). The series transmission line 310r implemented in the conductive wiring structure 314 can likewise be selected to provide appropriate impedance transformation from the transistor die 105 to the gate lead 102g.

Figure 4A:
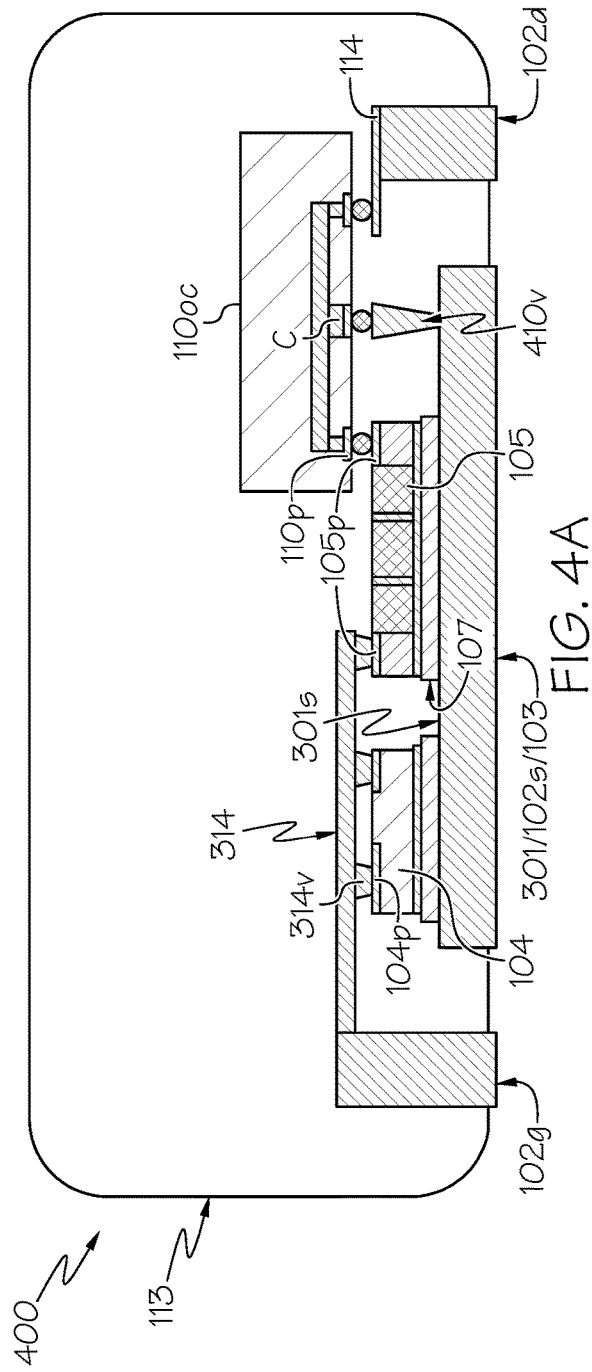
FIG. 4A is a cross-sectional view illustrating an example of an integrated circuit device package including stacked topology structures in accordance with some embodiments of the present disclosure.

FIG. 4A is a cross-sectional view illustrating an example of an integrated circuit device package including stacked topology structures in accordance with some embodiments of the present disclosure. As shown in FIG. 4A, RF power device package 400 includes an active die 105 and an integrated interconnect (illustrated as an IPD or other passive device 110oc) assembled on a substrate 301. As in the embodiment of FIG. 3A, the substrate 301 is a conductive structure 103 (e.g., a copper slug) that provides the attachment surface 301s, the source lead 102s, and thermal conductivity. The connections between the gate lead 102g, the capacitor chip 104, and the input of the transistor die 105 are implemented by conductive wiring structures 314, with the inductance for the input pre-matching network and harmonic termination implemented directly in the conductive traces and vias of the wiring structure 314. The passive device 110oc that provides electrical connections to the active die 105 is provided only at the output side of the package 500.

In FIG. 4A, the output capacitor chip 106 (e.g., high-density capacitors, which may be used for video bandwidth) are not located beneath the output IPD 110oc: rather, the output capacitance is integrated into the flip-chip output IPD 110oc, e.g., as metal-insulator-metal (MIM) capacitors C. The MIM capacitors C may be formed by providing an insulating material between one of the conductive elements of the IPD 110oc and one or more of the bond pads 110p in some embodiments. At least one conductive via or post 410v is used to connect one end of the integrated capacitor to the package ground, e.g., as provided by the conductive structure 103. In some embodiments, the conductive via(s) 410v may be implemented by copper via(s) in a RDL. The integration of the capacitance into the passive device 110oc shown in FIG. 4A can be used in any of the embodiments described herein, and can create a higher Q (lower loss) output pre-match, as the flip-chip IPD process is typically done with high-resistive silicon substrate, which has less losses than a MOS capacitor that may be placed beneath the flip-chip IPD. High-density video bandwidth (VBW) capacitors can still be connected to the output-pre-match IPD 110oc from a different location in the package 400.

Figure 4B:
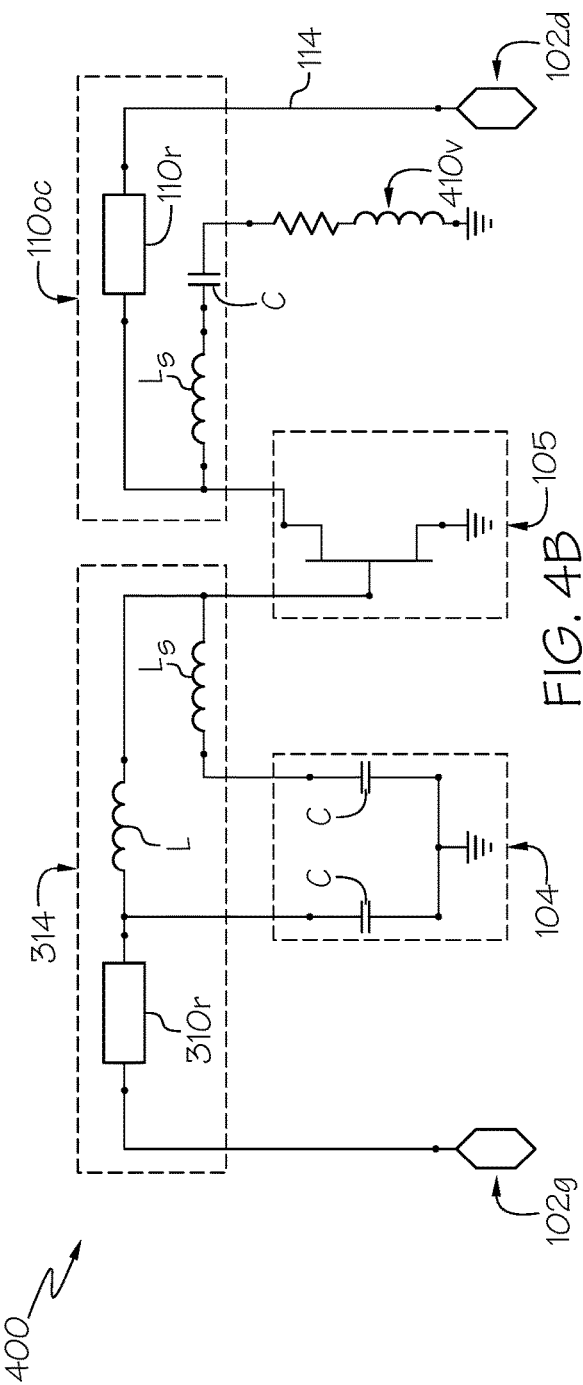
FIG. 4B is an equivalent circuit diagram of the embodiment of FIG. 4A.

FIG. 4B is an equivalent circuit diagram representing the embodiment of FIG. 4A. The output pre-matching network is implemented by a high-Q IPD 110oc and an integrated output capacitance (e.g., implemented by MIM capacitor C) to provide a shunt-L inductance Ls matching circuit (e.g., a high-pass Ls) for pre-matching the fundamental frequency f0. The integrated output capacitance C provided by the IPD 110oc is connected to the package ground by the conductive via 410v (which may itself provide some resistance and inductance). The series transmission line 110r in the output IPD 110oc can be selected to provide appropriate impedance transformation from the transistor die 105 to the drain 102d lead. The input pre-matching network is implemented by the conductive wiring structure 314 and the input capacitors 104 to provide an L-C matching circuit (e.g., a low-pass L-C) at the fundamental frequency f0, as well as a shunt-L inductance Ls matching circuit (e.g., a high-pass Ls), and the series transmission line 310r can likewise be selected to provide appropriate impedance transformation from the transistor die 105 to the gate lead 102g.

FIG. 5A is a cross-sectional view illustrating an example of an integrated circuit device package including stacked topology structures in accordance with some embodiments of the present disclosure. As shown in FIG. 5A, RF power device package 500 includes an active die 105 and an integrated interconnect (illustrated as an IPD or other passive device 110oc) assembled on a package substrate 501, which is implemented as a conductive structure 103 (e.g., a copper slug) that provides the attachment surface 501s, the source lead 102s, and thermal conductivity as in some other embodiments described herein. Likewise, the connections between the gate lead 102g, the capacitor chip 104, and the input of the transistor die 105 are implemented by conductive wiring structures 314, with the inductance for the input pre-matching network and harmonic termination implemented directly in the conductive traces and vias of the wiring structure 314. Also, similar to the embodiment of FIG. 4A, the passive device that provides electrical connections to the active die 105 is provided only at the output side of the package 500, and is implemented by a flip-chip IPD 110oc that includes the output capacitance integrated therein, with at least one conductive via 410v (e.g., copper via in RDL) connecting the integrated capacitor to the package ground.

In the embodiment of FIG. 5A, the series connection from the drain pad 105p of the transistor die 105 to the package drain lead 102d is shortened (as compared to the embodiment of FIG. 4A), in this example by positioning the package drain lead 102d adjacent to the source/thermal lead 102s, and in between the source/thermal lead 102s and the ground node G for the output capacitor. The embodiment of FIG. 5A may thus be advantageous in that inductance between the drain pad 105p of the transistor die 105 and the package drain lead 102d can be reduced to a very low value, which may be helpful and/or critical to performance in higher frequency operation, e.g. above 3 GHz operating frequency.

FIG. 5B an equivalent circuit diagram representing the embodiment of FIG. 5A, and may be similar to the equivalent circuit of FIG. 4B with respect to the input pre-matching network provided by the conductive wiring structure 314 and the input capacitors 104. The output pre-matching network is implemented by the flip-chip IPD 110oc, which provides a shunt-L inductance Ls matching circuit (e.g., a high-pass Ls) with the output capacitance C integrated therein and connected to the ground lead G by conductive via 410v.

Figure 5C:
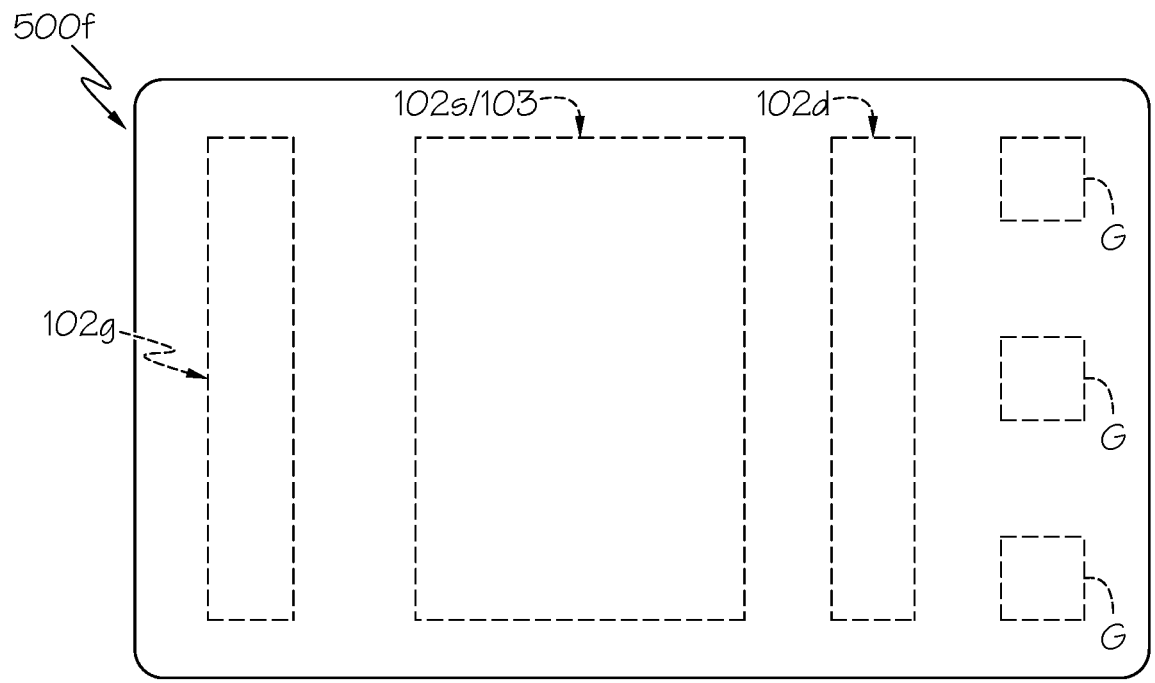
FIG. 5C is a bottom plan view illustrating a package footprint of the embodiment of FIG. 5A in accordance with some embodiments of the present disclosure.

As shown in FIGS. 5A and 5B, since the drain lead 102d exits the package 500 between the conductive structure 103 and output ground lead G, embodiments described herein provide a package footprint 500f and PCB circuit designs 515i, 515o to support this topology. FIG. 5C is a plan view illustrating the package footprint 500f for the embodiment of FIG. 5A. As shown in FIG. 5C, the ground connection to the output capacitance C integrated in the output IPD 110oc is implemented by multiple (shown as three) smaller ground leads G opposite the source/thermal lead 102s, with the drain lead 102d therebetween. The output ground lead(s) G can be aligned with corresponding grounded vias 515v in and to external circuit board 515, such as an RF circuit board as shown in FIG. 5D.

Figure 5D:
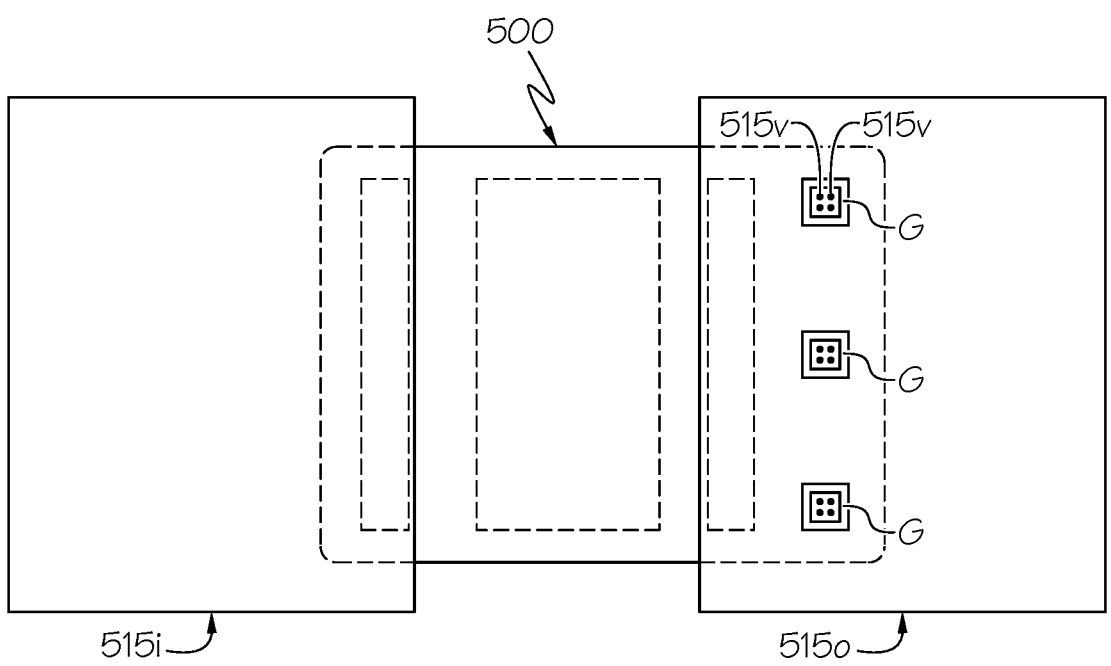
FIG. 5D is a top plan view illustrating the package footprint of the embodiment of FIG. 5C in accordance with some embodiments of the present disclosure.

In particular, FIG. 5D is a top plan view with a transparent package 500 that illustrates the underside of the package footprint 500f of FIG. 5C, and further illustrates the connections to an input matching circuit board 515i and an output matching circuit board 515O of the external circuit board 515. The input and output matching circuit boards 515i, 515O may include additional active and/or passive electrical components in some embodiments. The ground leads G may be large enough (e.g., in terms of surface area relative to the footprint 500f) to be manufactured, but small enough to not substantially degrade the performance of the output matching circuit board 515O.

FIGS. 6A and 6B are cross-sectional views illustrating examples of integrated circuit device packages including stacked topology structures in accordance with some embodiments of the present disclosure. As shown in FIGS. 6A and 6B, RF power device packages 600a and 600b include active dies 605i, 605o and an integrated interconnect (illustrated as an IPD or other passive device 610) assembled on a substrate 101. As in FIG. 1B, the substrate 101 is implemented as a conductive structure 103 (e.g., a copper slug) that provides the attachment surface 101s, the source lead 102s, and thermal conductivity (e.g., a heat sink) for transmitting heat away from the transistors of the transistor dies 605i, 605o, and the connections provided by the passive devices 610 are opposite to (rather than in) the attachment surface 101s or substrate 101.

In the embodiments of FIGS. 6A and 6B, the active dies 605i, 605o define a multi-stage packaged RF power amplifier device (shown as two stages by way of example). For example, the active die 605i may be a smaller transistor die to implement the driver stage, and the active die 605o may be larger transistor die 605o (e.g., about 7 to 10 times larger in periphery than the driver stage transistor die 605i) to implement the output or final stage of the amplifier. The transistor dies 605i, 605o are attached to the attachment surface 101s of the substrate 101/conductive structure 103 that provides the source/thermal lead 102s, with inter-stage capacitor chip 604 on the attachment surface 101s between the dies 605i, 605o. An inter-stage passive device 610 is attached to and provides electrical connections between the two transistor dies 605i, 605o.

In particular, as shown in FIGS. 6A and 6B, an IPD 610 is flip-chip mounted on top of the transistor dies 605i, 605o and inter-stage matching capacitor chip 604, such that the bond pads 610p of the IPD 610 are aligned with bond pads 605p and 604p of the transistor dies 605i, 605o and the capacitor chip 604. In particular, the bond pads 610p of the IPD 610 may contact one or more bond pads 605p of the driver stage transistor die 605i that provides a driver drain lead 605d, and one or more bond pads 605p of the output stage transistor die 605o that provides an output gate lead 605g. The IPD 610 may include conductive bumps 111 (e.g., conductive epoxy patterns or solder bumps, in some embodiments pre-attached to the IPD 610) for connecting the bond pads 610p to the bond pads 605p and 604p, without wire bonds therebetween. The top surfaces of the capacitor chip 604 and transistor dies 605i, 605o can be aligned to the same height by grinding the wafers (for the die or capacitor chip), and/or or by using pre-forms 107 of different thicknesses to align the heights of the elements 604, 605i, 605o for connection using the IPD 610.

In the multi-stage amplifier of FIGS. 6A and 6B, the IPD 610 includes passive components that define an inter-stage matching network that is configured to provide impedance matching between the output of the driver stage transistor die 605i and the input of the output stage transistor die 605o, that is, to match the load of the driver die 605i to the input of the final die 605o. Although illustrated with reference to two stages 605i and 605o, it will be understood that multiple input or output transistor dies may be present on the attachment surface 101s, with the output of one stage connected to the input of the next stage by respective IPDs 610. The connections from the package leads 102g and 102d to the gate and drain contact pads 605p of the dies 605i and 605o can be implemented by respective conductive wiring structures (illustrated as copper routing layers in RDL 614 in FIG. 6A and/or as a wire-bonds 14 in FIG. 6B), and/or by input/output impedance matching circuits and/or harmonic termination circuits (e.g., using integrated interconnects 110i/110o) as described herein.

Figure 6C:
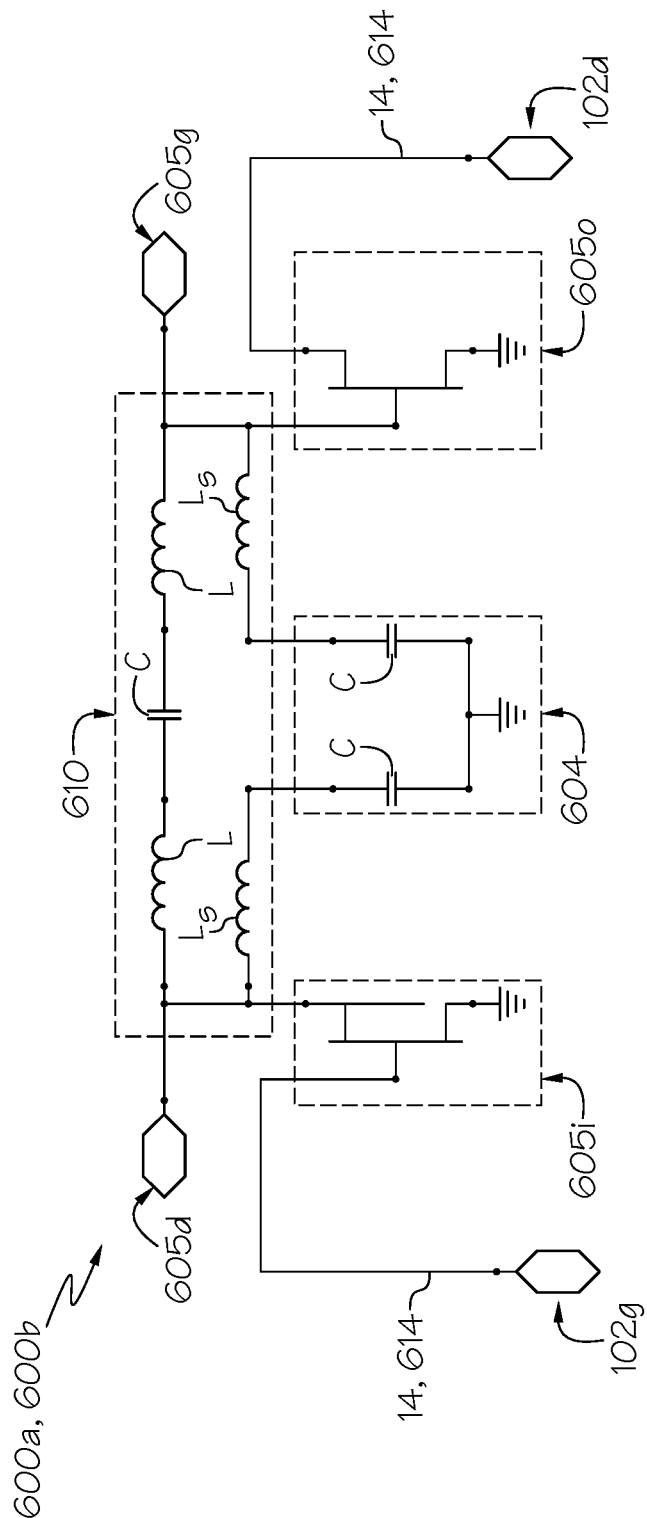
FIG. 6C is an equivalent circuit diagram of the embodiments of FIGS. 6A and 6B.

FIG. 6C is an equivalent circuit diagram representing the embodiments of FIGS. 6A and 6B. As shown in FIG. 6C, the inter-stage matching network is implemented by capacitors 604 and passive device 610 to provide a shunt-L pre-matching network Ls at the output of the driver stage transistor die 605i and at the input of the final stage transistor die 605o, as well as a series L-C-L network that connects the driver and final stage transistor dies 605i and 605o. This topology may provide a broadband response for a multi-stage RF power amplifier product. It will be understood that the inter-stage impedance matching network between the transistor dies 605i and 605o shown in FIG. 6C is by way of example only, and that inter-stage passive devices 610 that provide electrical connections between two or more active dies according to embodiments of the present disclosure may include or implement other network topologies.

FIG. 7A is a cross-sectional view illustrating an example of an integrated circuit device package including stacked topology structures in accordance with some embodiments of the present disclosure. As shown in FIG. 7A, an RF power device package 700 includes active dies 605i, 605o and an integrated interconnect (illustrated as an IPD or other passive device 610c) assembled on a substrate 101. As in FIG. 6A, the substrate 101 is implemented as a conductive structure 103 (e.g., a copper slug) that provides the attachment surface 101s, the source lead 102s, and thermal conductivity (e.g., a heat sink) for transmitting heat away from the transistors of the transistor dies 605i, 605o, and the active dies 605i, 605o define a multi-stage packaged RF power amplifier device. An inter-stage passive device 610c is attached (illustrated as flip-chip mounted) to and provides electrical connections between bond pads 610p thereof and bond pads 605p of the two transistor dies 605i, 605o.

In FIG. 7A, inter-stage matching capacitors 604 are not located beneath the inter-stage IPD 610c, but rather, the capacitance is integrated into the IPD 610c, e.g. as MIM capacitors. One or more conductive vias 610v connect ends of the integrated capacitors to the package ground, e.g., as provided by the conductive structure 103. In some embodiments, the conductive via(s) 610v may be implemented by copper via(s) in a RDL. As such, the IPD 610c includes the matching capacitance integrated therein to provide an inter-stage matching network that is configured to provide impedance matching between two or more amplifier stages implemented by the transistor dies 605i and 605o.

FIG. 7B is an equivalent circuit diagram representing the embodiments of FIG. 7A. As shown in FIG. 7B, the inter-stage matching network is implemented by the passive device 610c to provide a shunt-L pre-matching network Ls with a MIM or other integrated capacitor C at each of the output of the driver stage transistor die 605i and the input of the final stage transistor die 605o, as well as a series L-C-L network that connects the driver and final stage transistor dies 605i and 605o, similar to the embodiment of FIG. 6C.

FIGS. 8A and 9A are cross-sectional views illustrating examples of sub-components of integrated circuit device packages including stacked topology structures in accordance with some embodiments of the present disclosure. As shown in FIGS. 8A and 9A, RF power device package 800 and 900 each include an active die 105 and an integrated interconnect (illustrated as an IPD or other passive device 110i, 110c) assembled on a package substrate 201. The packages 800 and 900 include components and connections as in the embodiment shown in FIGS. 2A and 2B, with the substrate 201 implemented as a conductive structure 103 (e.g., a copper slug) that provides the attachment surface 201s, the source lead 102s, and thermal conductivity, and in some embodiments, a ground connection. The passive device 110i, 110c is provided only at the input side of the packages 800, 900 to provide electrical connection between a conductive pad 105p of the active die 105 and a gate lead 102g of the package by solder bumps 111 without wire bonds therebetween. The passive device 110i, 110c (shown as a flip-chip IPD) implements an input pre-matching network for the transistor circuits implemented by the active die 105, as in the embodiments of FIGS. 2A and 2B.

In FIG. 8A, a capacitor chip 104 (e.g., MOS capacitors) for the input matching network is provided on the attachment surface 101s adjacent the transistor die 105 and under the IPD 110i. The bond pads 105p and 104p of the transistor die 105 and the capacitor chip 104 are connected to bond pads 110p of the IPD 110i by respective solder bumps 111, without wire bonds therebetween.

In FIG. 9A, the input capacitors are integrated into the flip-chip input IPD 110c, e.g., as metal-insulator-metal (MIM) capacitors, and one or more conductive vias 110v (e.g., copper via(s) in a RDL) are used to connect the integrated capacitor(s) to the package ground, e.g., as provided by the conductive structure 103. In particular, one end of an integrated MIM cap may be connected to the electrical grounded copper slug 103 by copper vias 110v or pillars built into the laminate around the die. The inductance needed for pre-matching or harmonic termination at the input side of the transistor die 105 can be partially or fully incorporated into the copper vias/pillars, to provide a high-Q, low loss inductance.

In FIGS. 8A and 9A, the bond pads 110p of the IPD 110i, 110c are connected directly to the gate lead 102g, without conductive wiring structures therebetween. Likewise, the output of the transistor die 105 may be connected directly to the drain lead 102d. Both packages 800, 900 can be used as a sub-component in a packaged RF power product by connecting the drain and gate lead 102d and 102g to the leads of the package with wire bonds, or copper routing in an RDL. The drain lead 102d can also be connected to additional output pre-matching networks (e.g., by conductive wiring structures (such as copper routing in a RDL or wire bonds as shown in FIGS. 2A and 2B) or by IPDs as shown in FIGS. 1A and 1B) before connecting to the package output leads.

FIGS. 8B and 9B are equivalent circuit diagrams representing the embodiments of FIGS. 8A and 9A, respectively. Similar to the embodiment of FIG. 2C, an arrangement of inductors L, Ls is implemented in the IPDs 110i, 110c to provide an impedance pre-matching network for the transistor arrangement of the active die 105. In particular, the IPDs 110i, 110c and input capacitors (implemented by external capacitor chip 104 (e.g., MOS capacitors) in FIG. 8B: integrated capacitors C (e.g., MIM capacitors) in FIG. 9B) provide an L-C matching circuit (e.g., a low-pass L-C) at the fundamental frequency f0, as well as a shunt-L inductance Ls matching circuit (e.g., a high-pass Ls) for optimum termination of one or more harmonic frequencies (e.g., 2f0). In FIG. 9B, the capacitance that may be needed for pre-matching and harmonic termination is integrated into the IPD 110c.

Figure 10A:
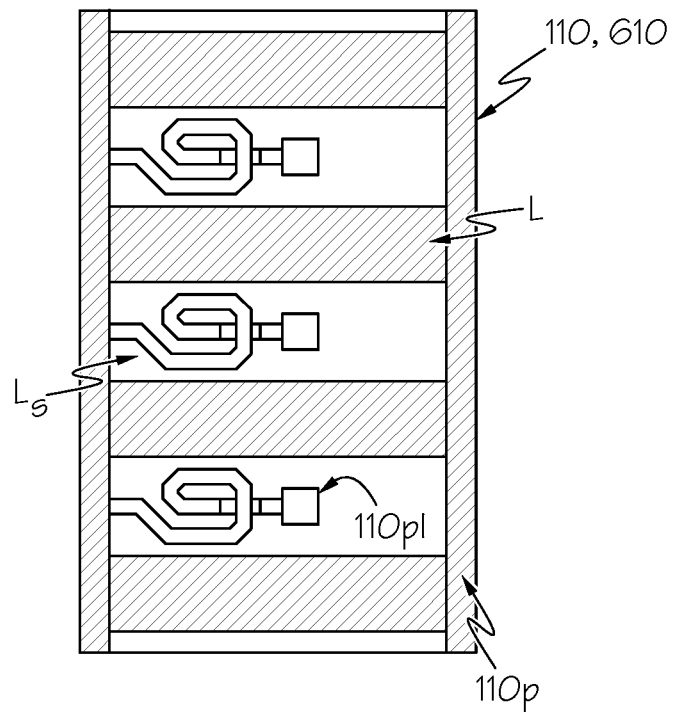
FIGS. 10A and 10B are plan and perspective views, respectively, illustrating examples of high-Q IPDs in accordance with some embodiments of the present disclosure.
Figure 10B:
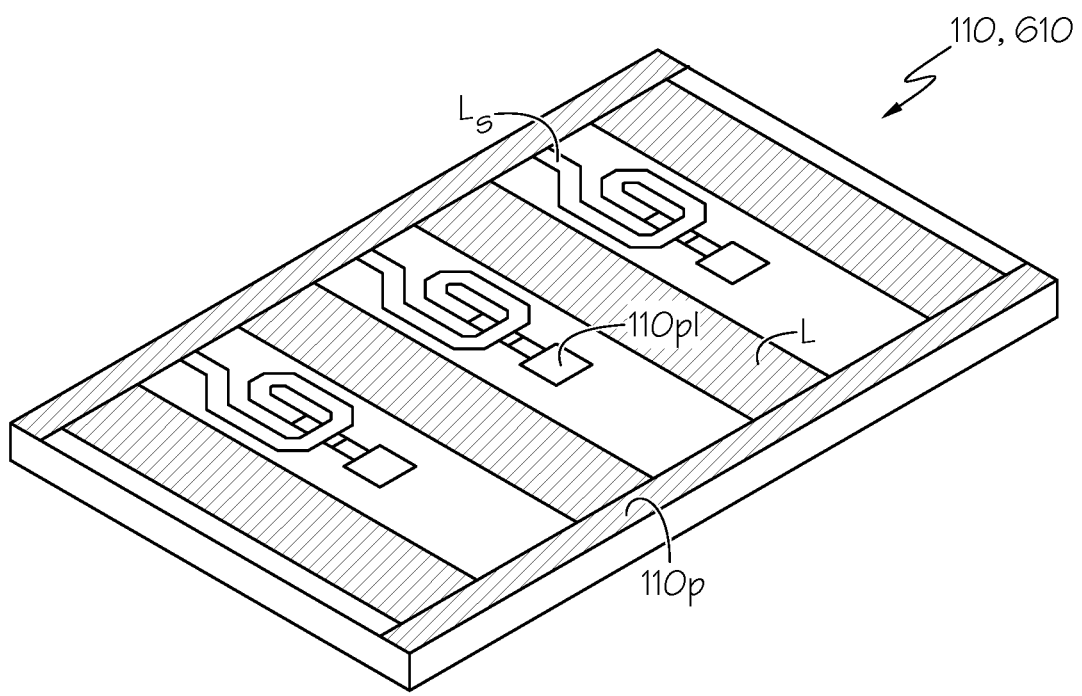

FIGS. 10A and 10B are plan and perspective views, respectively, illustrating examples of high-Q IPDs 110, 610 that provide impedance matching and integrated interconnects in accordance with some embodiments of the present disclosure. In the examples of FIGS. 10A and 10B, the precise value of shunt-L inductance needed for appropriate pre-matching of the transistor is implemented using coil inductors Ls. The shape, width and general design of the coil inductors Ls may be optimized to reduce losses. One end of the coil inductors Ls end on a bump or contact pad 110pl, which can be pre-attached with conductive bumps (e.g., 111) for attachment to the capacitors (e.g., 104) for pre-matching or high-density capacitors (e.g., 106) for improving video band-width. The width of the series connection strip L used to implement the series inductors can be configured to provide the desired impedance transformation from the transistor die to the drain leads. The series connection strips L may extend between bump or contact pads 110p, and can be treated as an extension of the board transmission line matching network, and width of each series connection strip L can be configured to provide the desired characteristic impedance. More generally, any of the passive devices described herein may include or may be implemented using series connection strips L that are coupled between contact pads 110p to provide electrical connection between the contact pads 105p of one or more active dies 105, and/or between the contact pads 105p an active die 105 and a package lead 102, in addition to impedance transformation therebetween. Likewise, any of the passive devices described herein may include or may be implemented using coil inductors Ls configured for connections to capacitors (e.g., capacitors integrated therein or external capacitors by contact pads 110pl).

Figure 11:
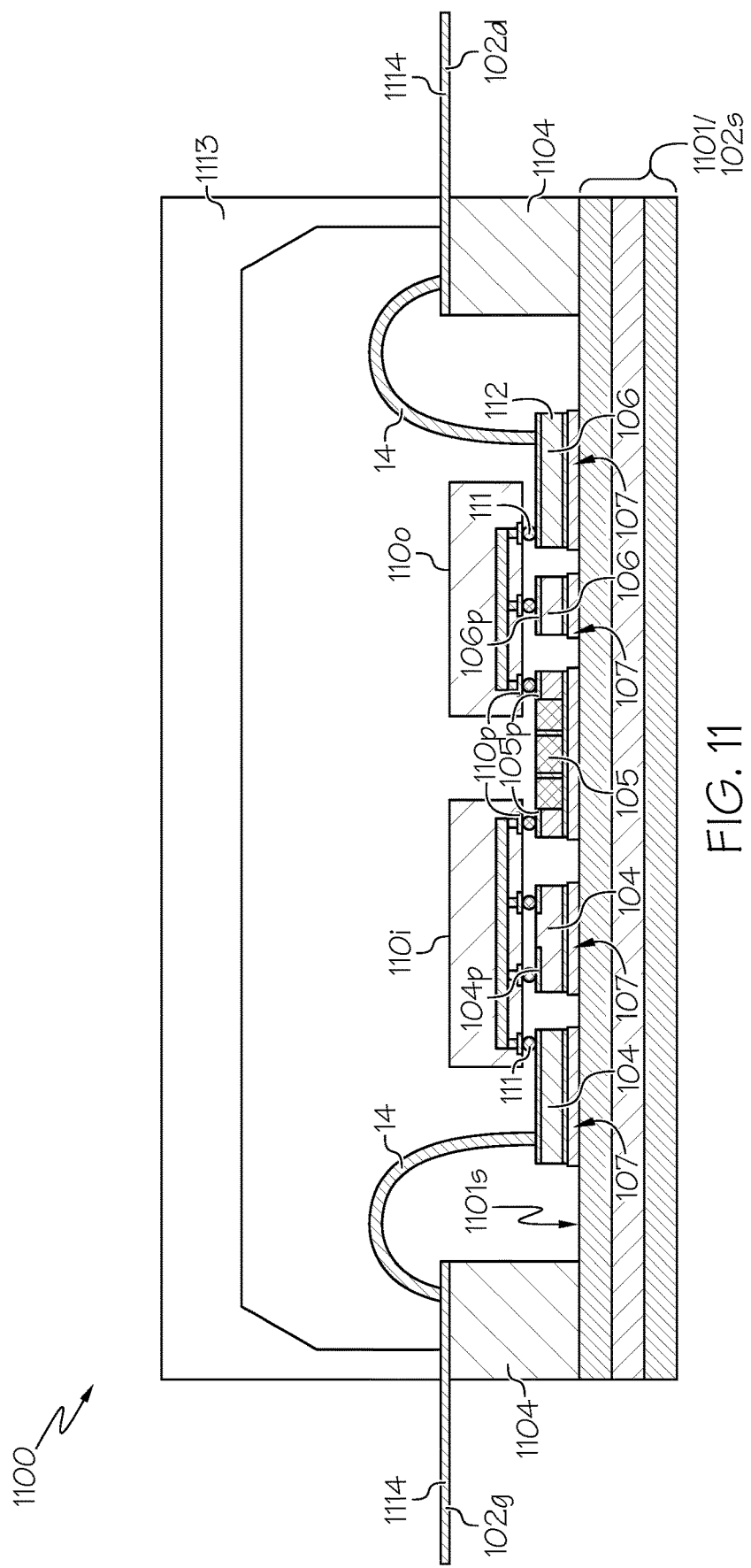
FIGS. 11 and 12 are cross-sectional views illustrating examples of thermally enhanced integrated circuit device packages including stacked topology structures in accordance with further embodiments of the present disclosure.
Figure 12:
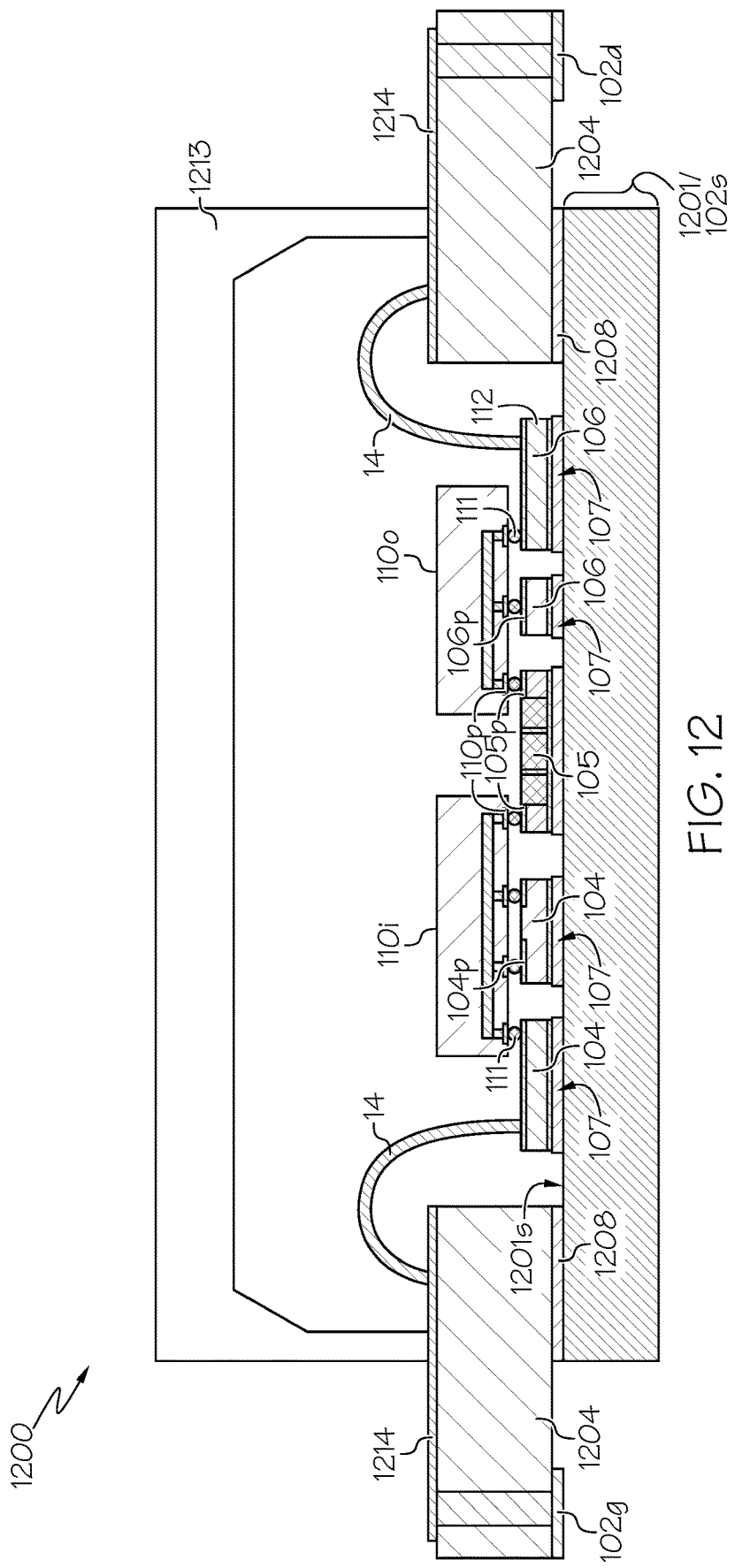

FIGS. 11 and 12 are cross-sectional views illustrating examples of thermally enhanced integrated circuit device packages including stacked topology structures in accordance with further embodiments of the present disclosure. The feature sizes in FIGS. 11 and 12 are exaggerated for ease of illustration. As shown in FIGS. 11 and 12, RF power device packages 1100, 1200 include components 104, 105, 106, 110 and connections similar to the packages 100a, 100b, and 100c of FIGS. 1A, 1B, and 1C, but are mounted on a conductive base or flange 1101, 1201 and protected by a lid member 1113, 1213 of thermally enhanced packages, rather than a plastic over mold 113. In particular, FIG. 11 illustrates a first implementation (referred to as a TEPAC package 1100) and FIG. 12 illustrates a second implementation (referred to as a T3PAC package 1200) of thermally enhanced packages in accordance with embodiments of the present disclosure.

The TEPAC package 1100 of FIG. 11 may be a ceramic-based package that includes a base 1101 and an upper housing, which may include a lid member 1113 and sidewall members 1104. The lid member 1113 and/or sidewalls 1104 may include ceramic materials (e.g., alumina) and may define an open cavity surrounding the components 104, 105, 106, 110 on the conductive base or flange 1101. The conductive base or flange 1101 provides both an attachment surface 1101s for the components 104, 105, 106, 110, as well as thermal conductivity (e.g., a heat sink) for dissipating or otherwise transmitting heat generated by the components outside of the package 1100.

The T3PAC package 1200 of FIG. 12 may also be a ceramic-based package that includes a base 1201 and an upper housing with a lid member 1213 and sidewall members 1204. The lid member 1213 and sidewalls 1204 similarly define an open cavity surrounding the components 104, 105, 106, 110 on the conductive base or flange 1201, which likewise provides both an attachment surface 1201s and thermal conductivity (e.g., a heat sink) for dissipating or otherwise transmitting heat outside of the package 1200. In the package 1200, the lid member 1213 may be a ceramic material (e.g., alumina), while the sidewall members 1204 are illustrated as printed circuit board (PCB).

In FIGS. 11 and 12, the flange 1101, 1201 may be an electrically conductive material, for example, a copper layer/laminate or an alloy or metal-matrix composite thereof. In some embodiments, the flange 1101 may include a copper-molybdenum (CuMo) layer, CPC (Cu/MoCu/Cu), or other copper alloys, such copper-tungsten CuW, and/or other laminate/multi-layer structures. In the example of FIG. 11, the flange 1101 is illustrated as a CPC-based structure to which the sidewalls 1104 and/or lid member 1113 are attached. In the example of FIG. 12, the flange 1201 is illustrated as a copper-molybdenum (RCM60)-based structure to which the sidewalls 1204 and/or lid member 1213 are attached, e.g., by a conductive glue 1208.

In FIGS. 11 and 12, the active die 105, passive devices (e.g., capacitor chips 104 and 106), and integrated interconnects (collectively 110) are attached to the attachment surface 1101s, 1201s of the flange 1101, 1201 by respective conductive die attach material layers 107. The flange 1101, 1201 also provides the source lead 102s for the package 1100, 1200. The gate lead 102g and drain lead 102d are provided by respective conductive wiring structures 1114, 1214, which are attached to the flange 1101, 1201 and supported by the respective sidewall members 1104, 1204.

The thicknesses of the sidewall members 1104, 1204, may result in a height differential between the components 104, 105, 106, 110 and the package leads 102g, 102d relative to the attachment surface 1101s, 1201s. For example, the combined height of the active die 105 and the integrated interconnects 110i, 110o thereon may be about 100 μm relative to the attachment surface 1101s, while the gate and drain leads 102g and 102d may be separated from the attachment surface 1101s by a distance of about 635 μm. In the examples of FIGS. 11 and 12, respective wire bonds 14 are thus used to connect the package leads 102g, 102d to contact pads 104p, 106p of the passive RF components 104, 106 on the attachment surface 1101s, 1201s. As such, an RF signal input on a the lead 102g may be passed through the wire bond 14 to input matching circuits 110i, 104 and to a gate terminal 105p of the RF transistor amplifier die 105, and the amplified output RF signal may be passed from the drain terminal 105p of the RF transistor amplifier die 105 to the output matching circuits 110o, 106 and from there to the bond wire 14 for output through lead 102d. It will be appreciated, however, that the wire bonds 14 may be omitted in other embodiments and different electrical connections may be used.

Integrated circuit device packages including stacked topology structures in accordance with embodiments of the present disclosure may provide further advantages in that the stacked interconnection structures may allow for thinner or reduced-height packages in comparison to some conventional designs. In over mold package embodiments (e.g., as shown in FIGS. 1-9), the routing of the package leads at the bottom of the package may also allow for packaging flexibility. For example, changes in height and/or spacing of the package leads can be accommodated by modifying the layout of the traces on the circuit board/PCB based on the modified package footprint. Thermally-enhanced package embodiments (e.g., as shown in FIGS. 11-12) may offer similar advantages, but may require changes to the package dimensions (e.g., flange height and/or package lead spacing) relative to standardized dimensions.

Accordingly, in embodiments of the present disclosure, electrical connections between components (e.g., between circuit-level components, such as between the contact pads of one or more active transistor dies, and/or between the contact pads of active transistor dies and the gate and/or drain leads of the package) are implemented by one or more integrated interconnect structures (e.g., conductive wiring structures and/or passive devices, such as IPDs) physically extending between the components, rather than by wirebonds. That is, the integrated interconnects may provide both an interconnection and an impedance matching/harmonic termination function, such that the use of wirebonds in the package can be reduced or eliminated.

As described herein, some embodiments of the present disclosure use high-Q IPDs 'flipped over' on top of the transistor and capacitors. The extra elevation of the IPD above the ground plane (e.g., as provided by conductive structures that may also define the attachment surface for the active dies) of the package leads to higher Q, and lower loss pre-match. The majority of the space beneath the flipped IPD can be used for capacitors, such as the high-density capacitors typically used on the output. Larger value capacitance can be used in the available space, thus improving the video-bandwidth of the device. To connect the RF signal from the IPD back to the RDL and gate/drain leads, a copper shim or IPD with TSVs can be used. The top of MOS capacitors and transistor die can be aligned to the same height by grinding the wafers (die or capacitors) to similar heights, or by using pre-form of different thickness to align the heights. The IPDs can be configured for both pre-matching of the fundamental frequency as well as optimum termination of one or more harmonic frequencies.

The transistor dies (e.g., 105) are illustrated herein in cross section, with reference to examples in which the gate and drain pads (e.g., 105p) are on a top side/upper surface and a source pad is on a bottom side/lower surface of the semiconductor layer structure. In some embodiments, a top side metallization structure of the transistor dies may include a plurality of gate, drain, and/or source 'fingers', which may be connected by one or more respective buses.

Figure 13:
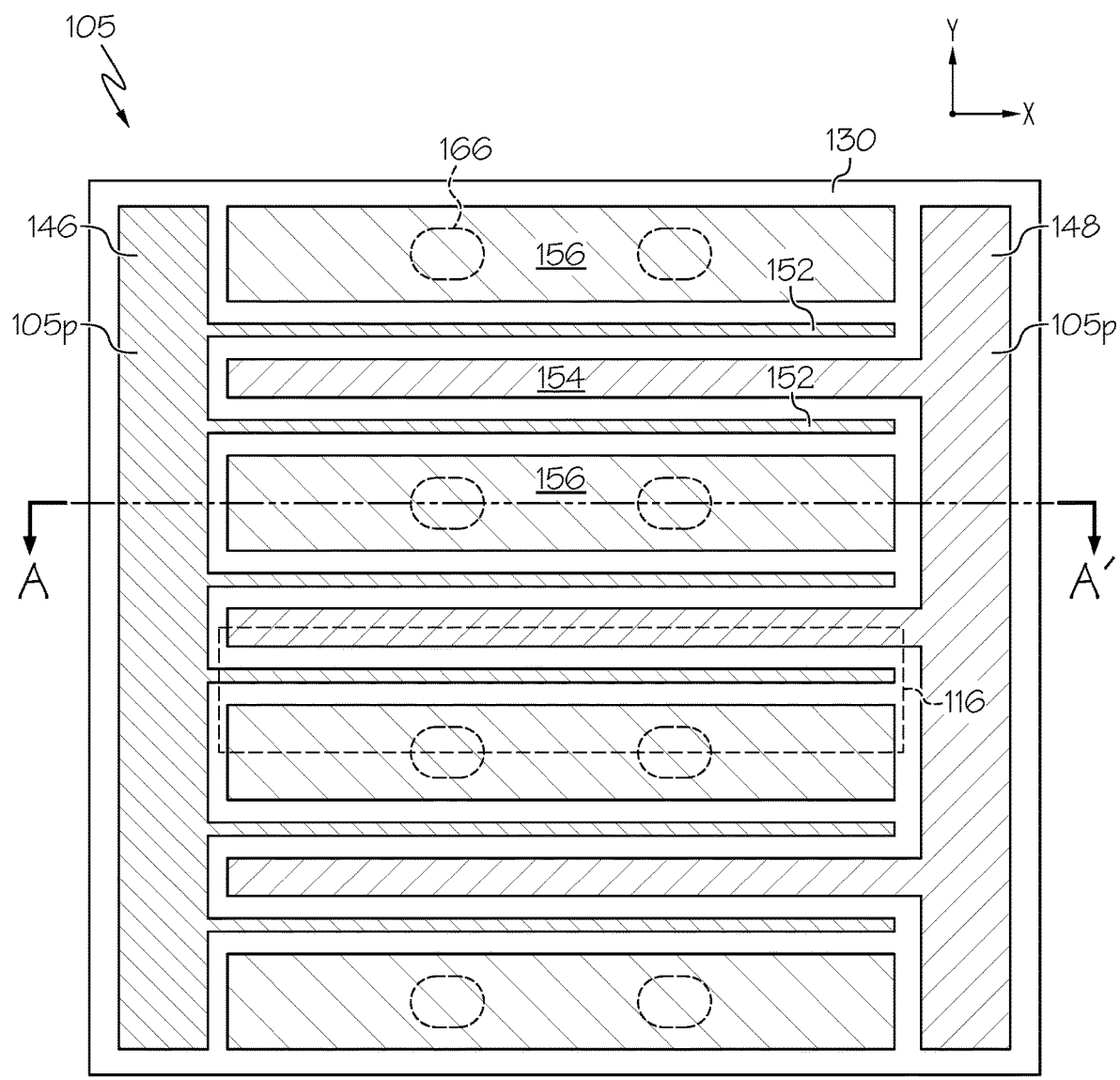
FIG. 13 is a cross-sectional view that is taken through a portion of the top side metallization structure of FIG. 1A.

FIG. 13 is a sectional view that is taken through a portion of the top side metallization structure of the die 105, along line A-A' of FIG. 1A. As shown in FIG. 13, the transistor die 105 includes a semiconductor layer structure 130 with plurality of unit cell transistors 116 provided in an upper portion of the semiconductor layer structure 130. Gate fingers 152, drain fingers 154, and source fingers 156 (and connecting buses) may define part of gate-, drain-, and source-connected electrodes of the die 105, respectively. The gate fingers 152 may be formed of materials that are capable of making a Schottky contact to a Group III nitride-based semiconductor material, such as Ni, Pt, Cu, Pd, Cr, W and/or WSiN. The drain fingers 154 and/or source fingers 156 may include a metal, such as TiAlN, that can form an ohmic contact to Group III nitride-based materials. The gate fingers 152 may be electrically connected to each other by a gate bus 146, and the drain fingers 154 may be electrically connected to each other by a drain bus 148. One or more dielectric layers that help isolate the gate-, drain-, and source-connected structures from each other are not shown to better illustrate the elements.

One of the unit cell transistors 116 is also shown in FIG. 13. As shown, the unit cell transistor 116 includes a gate finger 152, a drain finger 154 and a source finger 156 along with the underlying portion of the semiconductor layer structure 130. Since the gate fingers 152 are electrically connected to a common gate bus 146, the drain fingers 154 are electrically connected to a common drain bus 148, and the source fingers 156 are electrically connected together via the conductive source vias 166 and the source pad, it can be seen that the unit cell transistors 116 are all electrically connected together in parallel.

Embodiments of the present disclosure can be built on substrate or laminate (e.g., a redistribution layer (RDL) laminate), and assembled in batches using modern enhanced wafer level packaging techniques. Multiple parts can be built at once, reducing assembly time, cost, and yield issues. In addition, the wire-bonding process may be reduced or eliminated, saving time and cost. Heat generated by the transistor die can be removed effectively and conducted outside the package to a heat sink, for example, using a high-density copper filled array or embedded copper slug to effectively remove the heat (as typical hollow or partially filled vias will not remove the heat effectively enough for high power RF applications). Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications. Embodiments of the present disclosure may also be applied to radar and monolithic microwave integrated circuit (MMIC)-type applications.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. An integrated circuit device package, comprising:
   a substrate;
   a first die comprising active electronic components attached to the substrate; and at least one integrated interconnect structure on the first die opposite the substrate and comprising at least a portion of an input or output impedance matching network or harmonic termination between a circuit defined by the active electronic components of the first die and at least one package lead, the at least one integrated interconnect structure extending from the first die to the at least one package lead and providing electrical connection therebetween, wherein the at least one integrated interconnect structure is spaced apart from the first die opposite the substrate.

2. The integrated circuit device package of claim 1, wherein the electrical connection is free of a wire bond in the integrated circuit device package.

3. The integrated circuit device package of claim 1, wherein:
the first die comprises a first bond pad, which is electrically connected to one or more of the active electronic components, on a surface of the first die opposite the substrate; and
the at least one integrated interconnect structure comprises a contact pad that is on the first bond pad.

4. The integrated circuit device package of claim 3, wherein the at least one integrated interconnect structure comprises a conductive wiring pattern on a redistribution layer.

5. The integrated circuit device package of claim 3, wherein
the at least one integrated interconnect structure comprises at least a portion of the input or output impedance matching network for the circuit defined by the active electronic components of the first die.

6. The integrated circuit device package of claim 5, wherein the at least one integrated interconnect structure comprises a passive device comprising one or more passive electronic components.

7. The integrated circuit device package of claim 6, wherein the contact pad is a second bond pad, which is electrically connected to the one or more passive electronic components, on a surface of the passive device that is facing the surface of the first die, wherein the second bond pad is connected to the first bond pad by a conductive bump therebetween such that the surface of the passive device is separated from the surface of the first die.

8. The integrated circuit device package of claim 6, wherein the active electronic components of the first die define a first radio frequency (RF) amplifier circuit, wherein an adjacent die comprises active electronic components that define a second RF amplifier circuit, and wherein the first and second RF amplifier circuits are connected in a multi-stage amplifier arrangement.

9. The integrated circuit device package of claim 6, wherein the passive device comprises an integrated passive device (IPD) including at least one inductor and is free of active electronic components.

10. The integrated circuit device package of claim 9, wherein the IPD comprises an insulating material between conductive elements thereof to define at least one capacitor integrated therein.

11. The integrated circuit device package of claim 3, wherein:
an adjacent die comprises one or more capacitors and at least one capacitor bond pad that is on a surface of the adjacent die opposite the substrate;
the contact pad of the at least one integrated interconnect structure is a first contact pad; and
the at least one integrated interconnect structure further comprises at least one second contact pad that is on the at least one capacitor bond pad.

12. The integrated circuit device package of claim 11, wherein the at least one package lead comprises a gate lead and the first bond pad is a gate pad, wherein the adjacent die is between the first die and the gate lead, and wherein the at least one integrated interconnect structure comprises the input impedance matching network for the circuit.

13. The integrated circuit device package of claim 11, wherein the at least one package lead comprises a drain lead and the first bond pad is a drain pad, wherein the adjacent die is between the first die and the drain lead, and wherein at least one integrated interconnect structure comprises the output impedance matching network for the circuit.

14. The integrated circuit device package of claim 1, wherein the active electronic components comprise power transistor devices, and wherein the first die comprises at least one of a Group III-nitride or silicon carbide.

15. A radio frequency (RF) power amplifier device package, comprising:
a substrate;
a first die, comprising a plurality of transistor cells, attached to the substrate at a source pad on a bottom surface thereof and comprising a gate or drain pad at a top surface thereof opposite the substrate;
package leads configured to conduct electrical signals between the gate or drain pad of the first die and an external device; and
an integrated interconnect structure on the first die and spaced apart therefrom opposite the substrate, the integrated interconnect structure comprising a first contact pad on the gate or drain pad, and a second contact pad coupled to one of the package leads, and
wherein the integrated interconnect structure comprises at least a portion of an input or output impedance matching network between a circuit defined by the transistor cells of the first die and a package input or a package output provided by the one of the package leads.

16. The RF power amplifier device package of claim 15, wherein the integrated interconnect structure provides electrical connection from the gate or drain pad of the first die to the one of the package leads, wherein the electrical connection is free of a wire bond in the RF power amplifier device package.

17. The RF power amplifier device package of claim 15, wherein the integrated interconnect structure comprises a conductive wiring pattern on a redistribution layer or a passive device comprising one or more passive electronic components.

18. The RF power amplifier device package of claim 17, wherein the first contact pad is a bond pad, which is electrically connected to the one or more passive electronic components, on a surface of the passive device that is facing the top surface of the first die, wherein the bond pad is connected to the gate or drain pad by a conductive bump therebetween such that the surface of the passive device is separated from the top surface of the first die.

19. The RF power amplifier device package of claim 17, wherein the integrated interconnect structure further comprises a third contact pad coupled to an adjacent die, wherein the adjacent die comprises at least one bond pad on a surface thereof opposite the substrate and the third contact pad is on the at least one bond pad, and wherein:
the adjacent die comprises one or more capacitors; or
the adjacent die comprises a plurality of transistor cells that define a stage of an RF amplifier circuit.

20. The RF power amplifier device package of claim 15, wherein the first die comprises the gate pad and the drain pad at the top surface thereof.

21. The RF power amplifier device package of claim 15, wherein the integrated interconnect structure further comprises one or more inductors and a third contact pad, and further comprising:
   a second die comprising one or more capacitors attached to the substrate adjacent the first die, and a bond pad on a surface thereof opposite the substrate,
   wherein the integrated interconnect structure is stacked on the second die such that the third contact pad is on the bond pad and the second contact pad is on the one of the package leads.

22. The RF power amplifier device package of claim 21, wherein the substrate is configured to provide an electrical ground, and wherein a distance between the integrated interconnect structure and the substrate is configured such that a quality factor of the one or more inductors is substantially maintained.

* * * * *

UNITED STATES PATENT AND TRADEMARK OFFICE
CERTIFICATE OF CORRECTION

Page 1 of 1

PATENT NO. : 12,394,733 B2
APPLICATION NO. : 17/210660
DATED : August 19, 2025
INVENTOR(S) : Noori et al.

It is certified that error appears in the above-identified patent and that said Letters Patent is hereby corrected as shown below:

On the Title Page

Item (71) Applicant: Please correct "MACOM Technology Solutions Holdings, Inc., Durham, NC (US)" to read --MACOM Technology Solutions Holdings, Inc., Lowell, MA (US)--

In the Specification

Column 11, Lines 4-5: Please correct "device (s)" to read --device(s)--

Column 11, Lines 16-17: Please correct "high-Q IPD 110" to read --high-Q IPD $110_o$--

Column 14, Line 62: Please correct "5150" to read --$515_o$--

Column 15, Line 9: Please correct "5150" to read --$515_o$--

Column 15, Line 11: Please correct "5150" to read --$515_o$--

Column 15, Line 16: Please correct "5150" to read --$515_o$--

Column 21, Lines 33-34: Please correct "5 W," to read --5W,--

Signed and Sealed this
Eighteenth Day of November, 2025

John A. Squires
*Director of the United States Patent and Trademark Office*